(12) United States Patent
Shimamura et al.

(10) Patent No.: US 8,169,213 B2
(45) Date of Patent: May 1, 2012

(54) MAGNETIC FIELD ANALYSIS METHOD, MAGNETIZATION ANALYSIS DEVICE, AND RECORDING MEDIUM WITH COMPUTER PROGRAM

(75) Inventors: Hidenari Shimamura, Osaka (JP); Mitsutoshi Natsumeda, Osaka (JP)

(73) Assignee: Hitachi Metals, Ltd., Tokyo (JP)

(*) Notice: Subject to any disclaimer, the term of this patent is extended or adjusted under 35 U.S.C. 154(b) by 215 days.

(21) Appl. No.: 12/447,354

(22) PCT Filed: Oct. 31, 2007

(86) PCT No.: PCT/JP2007/071232
§ 371 (c)(1),
(2), (4) Date: Apr. 27, 2009

(87) PCT Pub. No.: WO2008/053921
PCT Pub. Date: May 8, 2008

(65) Prior Publication Data
US 2010/0060266 A1    Mar. 11, 2010

(30) Foreign Application Priority Data
Oct. 31, 2006 (JP) .................... 2006-297004

(51) Int. Cl.
*G01N 27/74* (2006.01)
(52) U.S. Cl. ...................... 324/205; 335/284
(58) Field of Classification Search .............. 324/205; 335/284
See application file for complete search history.

(56) References Cited

U.S. PATENT DOCUMENTS

| 5,285,393 A | * | 2/1994 | Abele et al. ............... 700/117 |
| 5,302,893 A | * | 4/1994 | Yoshimura ............. 324/207.22 |
| 5,808,392 A | * | 9/1998 | Sakai et al. ............... 310/214 |
| 5,978,694 A | * | 11/1999 | Rapoport ................... 600/407 |
| 6,456,059 B1 | * | 9/2002 | Blakely ...................... 324/127 |
| 6,684,483 B2 | * | 2/2004 | Rahman et al. ............ 29/596 |

(Continued)

FOREIGN PATENT DOCUMENTS
JP    2000-346919 A    12/2000
(Continued)

OTHER PUBLICATIONS

Kaitenki no Virtual Engineering no Tameo Denjikai Kaisekl Gijutsu, Technical Report of the Institute of Electrical Engineers of Japan No. 776, The Institute of Electrical Engincors of Japan, Mar. 15, 2000. EP Search Report issued in EP application No. 07830966.3 dated Jan. 3, 2012.

*Primary Examiner* — Reena Aurora
(74) *Attorney, Agent, or Firm* — Birch, Stewart, Kolasch & Birch, LLP

(57) ABSTRACT

It is possible to perform accurate magnetization analysis by considering the magnetic state of an incomplete magnetic region. A magnetization analysis device performs magnetization analysis by using a magnetizer parameter associated with a magnetizer and a magnet parameter associated with a magnet material so as to calculate a magnetization magnetic field applied to respective portions of the magnet material (S17), calculates a recoil ratio permeability and a coercivity as region of a permanent magnet as an analysis object for the respective portions according to the calculation result of the magnetized magnetic field and the demagnetization curve associated with the incomplete magnetization region actually measured in advance (S18), and performs a magnetic field analysis by using the calculation result of the region parameter so as to calculate a state parameter indicating the magnetized state of the permanent magnet as an analysis object (S19).

8 Claims, 25 Drawing Sheets

U.S. PATENT DOCUMENTS

| | | | |
|---|---|---|---|
| 6,967,551 B2 * | 11/2005 | Natsumeda et al. | 335/284 |
| 7,058,527 B2 * | 6/2006 | Shimizu | 702/66 |
| 7,236,899 B1 * | 6/2007 | Shimizu | 702/66 |
| 2005/0151609 A1 * | 7/2005 | Natsumeda et al. | 335/284 |
| 2006/0047196 A1 * | 3/2006 | Katzenelson et al. | 600/410 |

FOREIGN PATENT DOCUMENTS

| | | |
|---|---|---|
| JP | 2002-329624 A | 11/2002 |
| JP | 2004-127058 A | 4/2004 |
| WO | WO 2005/106720 A2 | 11/2005 |

* cited by examiner

F I G. 5
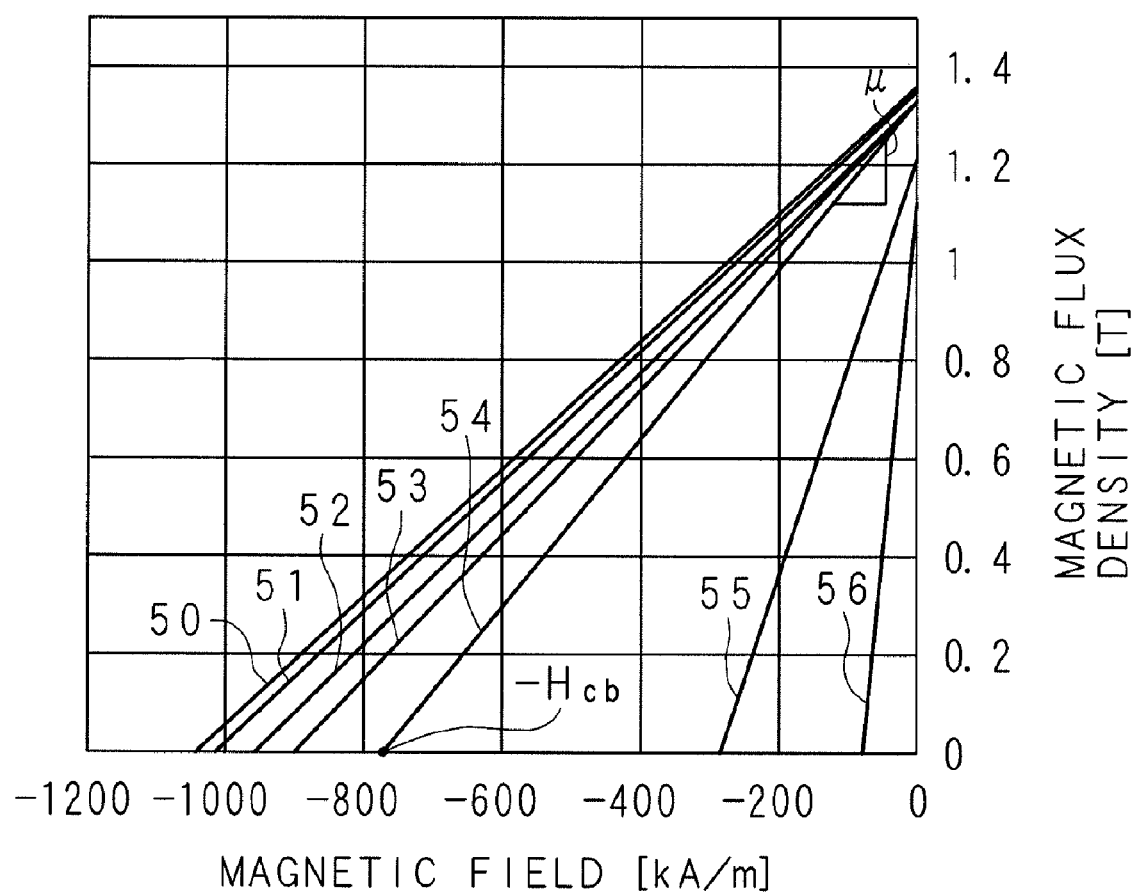

F I G. 1 3
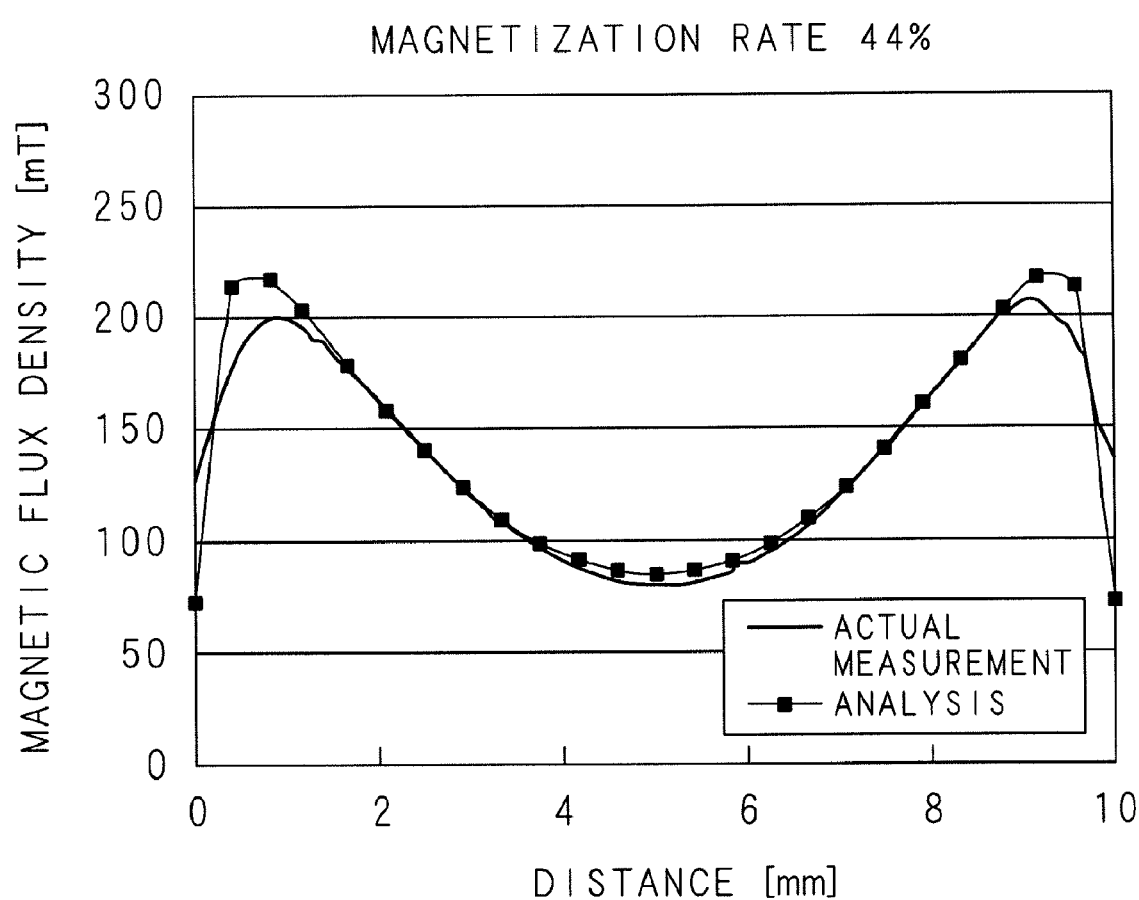

F I G. 18
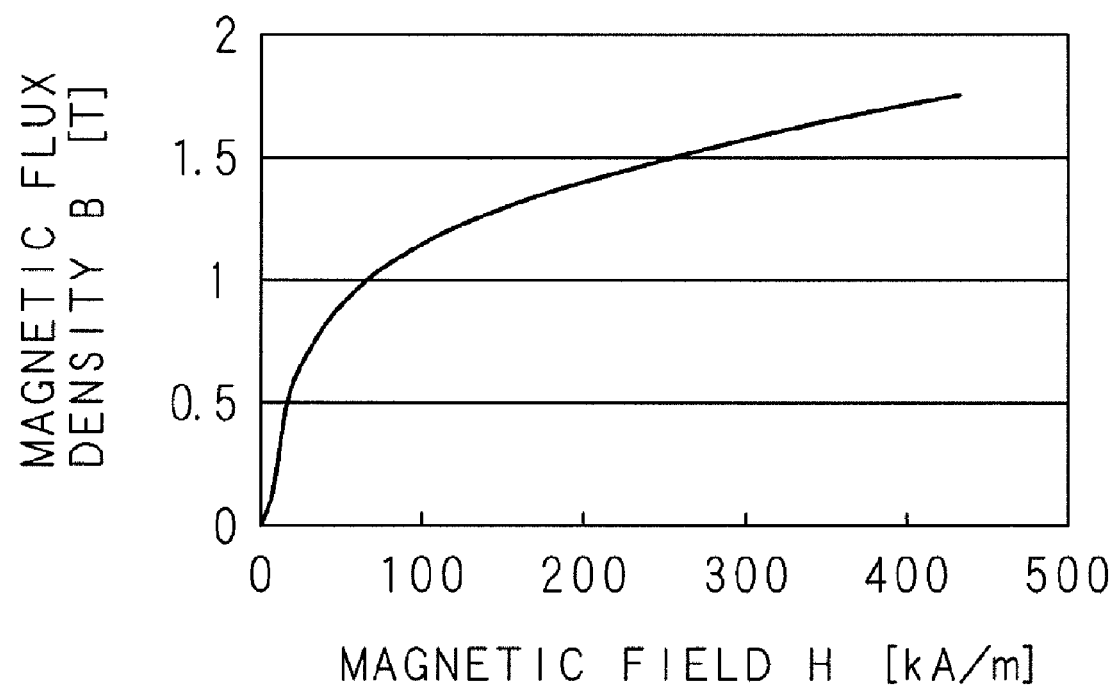

F I G. 2 1
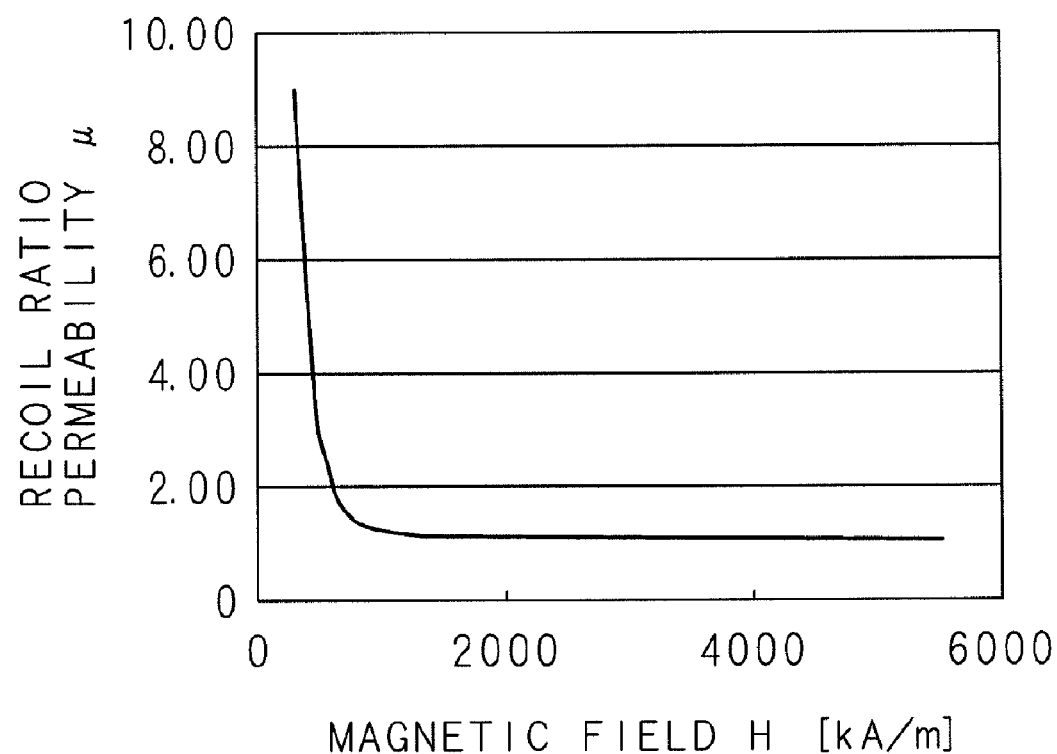

MAGNETIC FIELD ANALYSIS METHOD, MAGNETIZATION ANALYSIS DEVICE, AND RECORDING MEDIUM WITH COMPUTER PROGRAM

This application is the national phase under 35 U.S.C. §371 of PCT International Application No. PCT/JP2007/071232 which has an International filing date of Oct. 31, 2007 and designated the United States of America.

BACKGROUND

1. Field of the Invention

The present invention relates to a magnetic field analysis method and a magnetization analysis device for analyzing a magnetic state of a permanent magnet obtained by magnetizing a magnetic material with a magnetizer, and a recording medium with computer program.

2. Description of Related Art

In the present description, a permanent magnet means an object magnetized by applying a magnetic field to a magnetic material, and the magnetic material means an object before the magnetization.

Conventionally, there have been proposed various methods, devices, or the like for calculating parameters that represent a magnetic state of a permanent magnet obtained by magnetizing the magnetic material (for performing a magnetization analysis) (see Japanese Patent Application Laid-Open No. 2000-346919 and Japanese Patent Application Laid-Open No. 2002-329624).

Japanese Patent Application Laid-Open No. 2000-346919 discloses a magnetization analysis device that displays a plurality of types of candidates for a first parameter which is required when the magnetization analysis is performed on a display screen, determines a required first parameter among the displayed candidates, requests to input a plurality of second parameters which determine the characteristics of the first parameter, and calculates a magnetic field distribution which represents a magnetic state of a permanent magnet on the basis of the inputted first and second parameters.

Japanese Patent Application. Laid-Open No. 2002-329624 discloses a magnetization analysis device that calculates a parameter, corresponding to a system which includes a magnetizer and a magnetic material, on the basis of a set inherent parameter and a characteristic of the magnetic material, calculates a current waveform flowing to the magnetizer on the basis of the set inherent parameter and a parameter corresponding to the system, and calculates a magnetization distribution which represents a magnetic state of a permanent magnet on the basis of the calculated current waveform.

SUMMARY

A design of equipment, which uses a permanent magnet, such as a pick up, a motor, or the like, is necessary to consider a magnetic state of the permanent magnet.

However, conventional magnetic field analysis methods may cause the magnetic state which is obtained by the magnetization analysis to be different from a magnetic state which is actually measured. Therefore, a desired characteristic may not be obtained, because an equipment characteristic that is planed at design time is different from an equipment characteristic of the actually manufactured equipment.

In order to prevent the divergence between the analysis result and the actual measurement result of the magnetic state of the permanent magnet, the present inventors have focused attention on an incomplete magnetization region (a region which can not be magnetized until the permanent magnet is saturated. For example, a neutral zone that is located between poles of the permanent magnet which is magnetized with multipolar or the like).

A conventional magnetization analysis has been performed without considering the incomplete magnetization region. That is, when the magnetization analysis is performed, the incomplete magnetization region is not considered at all or not sufficiently considered. For example, it is assumed for the conventional magnetization analysis that the whole portion of the permanent magnet is the completely magnetized region (i.e., the magnetization rate is 100%), or the incomplete magnetization region is a non-magnetized region (i.e., the magnetization rate is 0%).

In addition, the Japanese Patent Application Laid-Open No. 2000-346919 and Japanese Patent Application Laid-Open No. 2002-329624 do not mention about the incomplete magnetization region at all. Thus, the Japanese Patent Application Laid-Open No. 2000-346919 and Japanese Patent Application Laid-Open No. 2002-329624 do not consider the presence of the incomplete magnetization region for the process of the magnetization analysis at all.

The present invention has been achieved in view of the foregoing circumstances, and a primary object thereof is to provide a magnetic field analysis method that allows to consider the magnetic state of the incomplete magnetization region with the use of a demagnetization curve which is obtained by actually measuring each portion of the incomplete magnetization region in advance and corresponds to an applied magnetizing magnetic field.

Another object of the present invention is to provide a magnetic field analysis method and a magnetization analysis device, that can perform the magnetization analysis with high precision while reflecting the magnetic state of the incomplete magnetization region, by calculating a state parameter representing the magnetic state of a permanent magnet to be analyzed with the use of a region parameter related to the incomplete magnetization region that is calculated on the basis of the calculation result of the magnetic field being applied to a magnetic material and the demagnetization curve, which is obtained by actually measuring each portion of the incomplete magnetization region in advance and corresponds to the applied magnetizing magnetic field, and a computer program that causes a computer to function as the magnetization analysis device.

Still another object of the present invention is to provide a magnetic field analysis method that can perform the magnetization analysis with high precision while reflecting a demagnetization characteristic of the incomplete magnetization region with the use of recoil ratio permeability and coercivity as region parameters for the incomplete magnetization region.

A magnetic field analysis method according to a first aspect is a magnetic field analysis method for analyzing a magnetic state of a permanent magnet obtained by magnetizing a magnetic material with a magnetizer, wherein a region parameter related to an incomplete magnetization region of the permanent magnet to be analyzed is calculated, when the magnetic state is analyzed, with the use of a demagnetization curve that is obtained by actually measuring each portion of the incomplete magnetization region of the permanent magnet in advance and corresponds to an applied magnetizing magnetic field.

A magnetic field analysis method according to a second aspect calculates the applied magnetizing magnetic field to each portion of the magnetic material by performing a magnetic field analysis with the use of a magnetizer parameter related to the magnetizer and a magnet parameter related to the magnetic material, calculates the region parameter for the each portion on the basis of the calculation result for the magnetizing magnetic field and of the demagnetization curve, and calculates a state parameter representing the magnetic state of the permanent magnet to be analyzed by performing the magnetic field analysis with the use of the calculation result for the region parameter.

A magnetic field analysis method according to a third aspect uses a recoil ratio permeability and a coercivity, as the region parameter, that approximately represent a demagnetization characteristic of the incomplete magnetization region.

A magnetization analysis device according to a fourth aspect is a magnetization analysis device for analyzing a magnetic state of a permanent magnet obtained by magnetizing a magnetic material with a magnetizer, comprising: a magnetizing magnetic field calculating means that calculates the magnetic field being applied to each portion of the magnetic material by performing a magnetic field analysis with the use of a magnetizer parameter related to the magnetizer and a magnet parameter related to the magnetic material; a parameter calculating means that calculates region parameters for each portion of an incomplete magnetization region of the permanent magnet to be analyzed, on the basis of the calculation results by the magnetizing magnetic field calculating means and of a demagnetization curve which is obtained by actually measuring the each portion of the incomplete magnetization region of the permanent magnet in advance and corresponds to the applied magnetizing magnetic field; and a magnetic state calculating means that calculates a state parameter representing the magnetic state of the permanent magnet to be analyzed, by performing the magnetic field analysis with the use of the calculation result by the parameter calculating means.

A computer program according to a fifth aspect is a computer program for causing a computer to analyze a magnetic state of a permanent magnet obtained by magnetizing a magnetic material with a magnetizer, comprising: a step of causing the computer to calculate the magnetic field being applied to each portion of the magnetic material by performing a magnetic field analysis with the use of a magnetizer parameter related to the magnetizer and a magnet parameter related to the magnetic material; a step of causing the computer to calculate region parameters for each portion of an incomplete magnetization region of the permanent magnet to be analyzed, on the basis of the calculation results for the magnetic field being applied to each portion of the magnetic material and of a demagnetization curve which is obtained by actually measuring the each portion of the incomplete magnetization region of the permanent magnet in advance and corresponds to the applied magnetizing magnetic field; and a step of causing the computer to calculate a state parameter representing the magnetic state of the permanent magnet to be analyzed, by performing the magnetic field analysis with the use of the calculation result for the region parameters.

In the first aspect, when the magnetic state is analyzed, the region parameter related to the incomplete magnetization region of the permanent magnet to be analyzed is calculated with the use of the demagnetization curve that is related to the incomplete magnetization region and obtained by actually measuring in advance, i.e., the demagnetization curve which is obtained by actually measuring each portion in the incomplete magnetization region of the permanent magnet in advance and corresponds to the applied magnetizing magnetic field.

The region parameter mentioned herein comprises, e.g., a recoil ratio permeability and a coercivity that are determined on the basis of the demagnetization curve corresponding to the magnetizing magnetic field, and the like.

A demagnetization curve for the incomplete magnetization region has been conventionally defined, on the basis of e.g., a demagnetization curve for the completely magnetized region, to be a similar figure of the demagnetization curve for the completely magnetized region. However, since such the defined demagnetization curve for the incomplete magnetization region is sometimes considerably different from the actual demagnetization curve for the incomplete magnetization region, there is a case where the magnetic state obtained as the result of magnetization analysis with the use of such the defined demagnetization curve is greatly different from the actual magnetization state.

On the other hand, when the magnetic state is analyzed with the use of the demagnetization curve for the incomplete magnetization region that is obtained by actually measuring in advance, the region parameter can be obtained from the demagnetization curve to reflect the actual magnetization state, so that the magnetic state as the result of magnetization analysis substantially coincides with the actual magnetization state.

Although demagnetization curves are different in accordance with types of the permanent magnets, e.g. quality of material or grade, it is to be noted that the identical demagnetization curve can be used for the same type of permanent magnets, regardless of different shapes, sizes, or the like. Therefore, it is not necessary to individually prepare each actually measured demagnetization curve for e.g. each different shape or size of the permanent magnet, respectively.

In each of the second, fourth, and fifth aspects, the state parameter representing the magnetic state of the permanent magnet to be analyzed is calculated on the basis of the region parameter for the incomplete magnetization region of the permanent magnet to be analyzed.

For example, the magnetization analysis device according to the fourth aspect is obtained by installing the computer program according to the fifth aspect into a personal computer, a sever, or the like. Then, the magnetic field analysis method according to the second aspect is executed with the use of this magnetization analysis device.

The magnetizer parameter mentioned herein means to correspond to the number of turns and a resistance value of an air-core coil, an electrostatic capacitance and a magnetizing voltage of a capacitor, an internal resistance value of the magnetizer, and the like which are related to the magnetizer. The magnet parameter mentioned herein means to correspond to a resistance value, an initial magnetization curve, and the like which are related to the magnetic material. The state parameter mentioned herein means to correspond to the magnetic state of the permanent magnet.

A specific description will be given hereinbelow by taking the operation of the magnetization analysis device as an example.

First, the magnetizing magnetic field calculating means performs the magnetic field analysis by a finite element method, an integral element method, or the like, with the use of the magnetizer parameter such as a coil configuration, a power source circuit, or the like related to the magnetizer which applies a magnetic field to magnetize the magnetic material, and the magnet parameter such as the initial magnetization curve, the resistance value, or the like related to the magnetic material. Then, the magnetizing magnetic field calculating means calculates the magnetizing magnetic field applied to each portion of the magnetic material. Of course, it is necessary to consider an eddy current when the magnetic field analysis is performed.

Next, the parameter calculating means calculates the region parameter for the incomplete magnetization region of the permanent magnet to be analyzed, for each portion of the magnetic material, on the basis of the calculation result by the magnetizing magnetic field calculating means and of the demagnetization curve for incomplete magnetization region that is obtained by actually measuring in advance.

Since this demagnetization curve for the incomplete magnetization region is obtained by actually measuring in advance, the calculated region parameter for the incomplete magnetization region reflects the magnetic state of the incomplete magnetization region.

Finally, the magnetic state calculating means performs the magnetic field analysis by a finite element method, an integral element method, or the like, with the use of the calculation result by the parameter calculating means (i.e., the region parameter that reflects the magnetic state of the incomplete magnetization region). Then, the magnetic state calculating means calculates the state parameter representing the magnetic state of the permanent magnet to be analyzed.

Thus, the magnetic state of the permanent magnet is analyzed with high precision while consideration is given to the magnetic state of the incomplete magnetization region.

It is possible to easily perform the magnetic field analysis by the finite element method, the integral element method, or the like, with a procedure substantially similar to a conventional procedure.

In the third aspect, the region parameters for the incomplete magnetization region are the recoil ratio permeability and the coercivity. Consequently, the parameter calculating means of the magnetization analysis device according to the fourth invention calculates the recoil ratio permeability and the coercivity as the region parameters.

Each of the recoil ratio permeability and the coercivity is easily calculated on the basis of the demagnetization curve for the incomplete magnetization region that is obtained by actually measuring in advance, and approximately represents the demagnetization characteristic of the incomplete magnetization region. That is, the calculated recoil ratio permeability and the coercivity reflect the magnetic state for the incomplete magnetization region.

The magnetic field analysis method according to the first aspect can cause the analysis result to reflect the magnetic state of the incomplete magnetization region, since the analysis for the magnetic state of the permanent magnet is performed with the demagnetization curve for the incomplete magnetization region that is obtained by actually measuring in advance.

Thus, it has advantages to prevent the divergence between the analysis result and the actual measurement result of the magnetic state of the permanent magnet. Consequently, it has advantages for the equipment that is designed on the basis of the analysis result of the magnetic state of the permanent magnet, to coincide the equipment characteristic that is planed at design time with the equipment characteristic of the actually manufactured equipment.

The magnetic field analysis method according to the second aspect, the magnetization analysis device according to a fourth aspect, and the computer program according to a fifth aspect have advantages to perform easily the magnetic field analysis with high precision and easy procedures, considering the magnetic state of the incomplete magnetization region, since they use the region parameter reflecting the magnetic state for the incomplete magnetization region.

The magnetic field analysis method according to the third aspect has advantages to perform the magnetic field analysis with high precision and easy procedures, since it approximates the demagnetization characteristic of the incomplete magneization region by the recoil ratio permeability and the coercivity.

The above and further objects and features of the invention will more fully be apparent from the following detailed description with accompanying drawings.

BRIEF DESCRIPTION OF THE SEVERAL VIEWS OF THE DRAWINGS

FIG. 5 is a characteristic view showing a demagnetization curve used in the magnetic field analysis method according to the embodiment 1 of the present invention;

FIG. 13 is a characteristic view showing an analysis result of the permanent magnet with a magnetization rate of 44% that is calculated by the magnetization analysis according to the embodiment 1 of the present invention;

Figure 14:
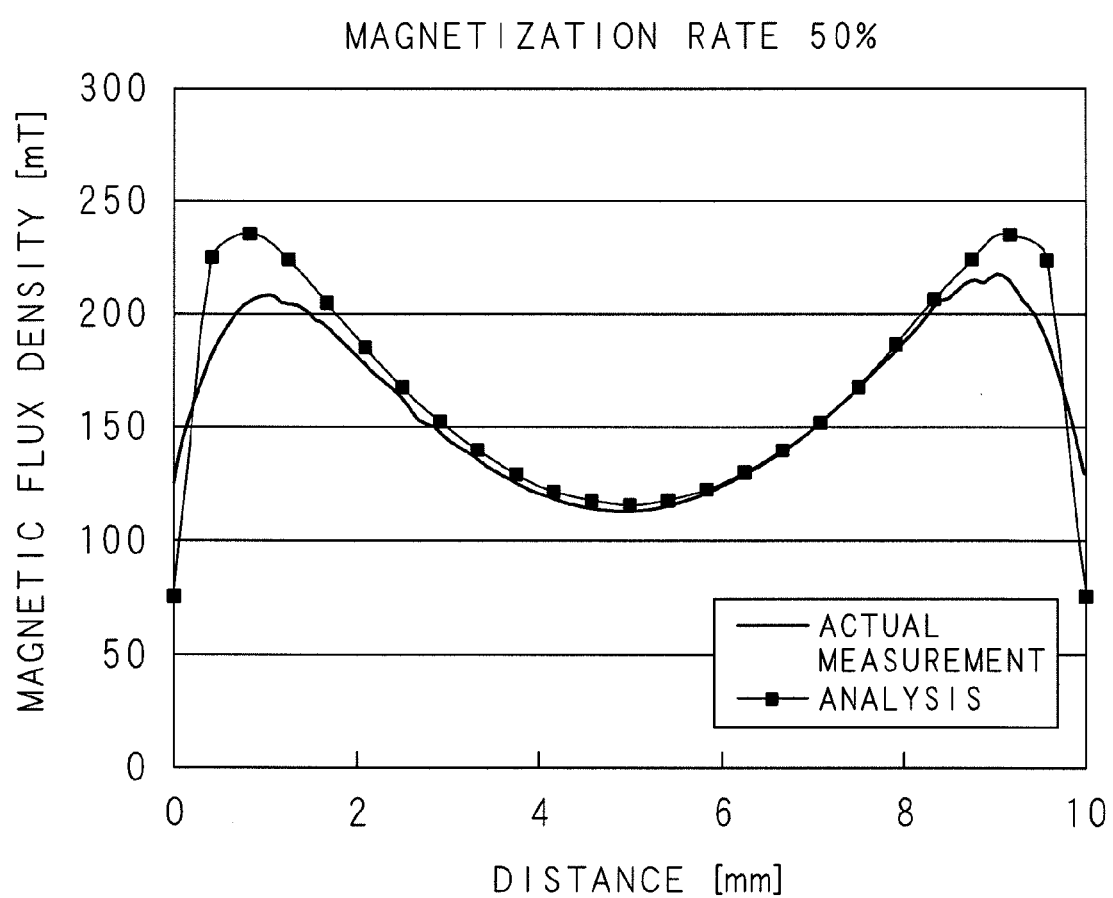
Figure 15:
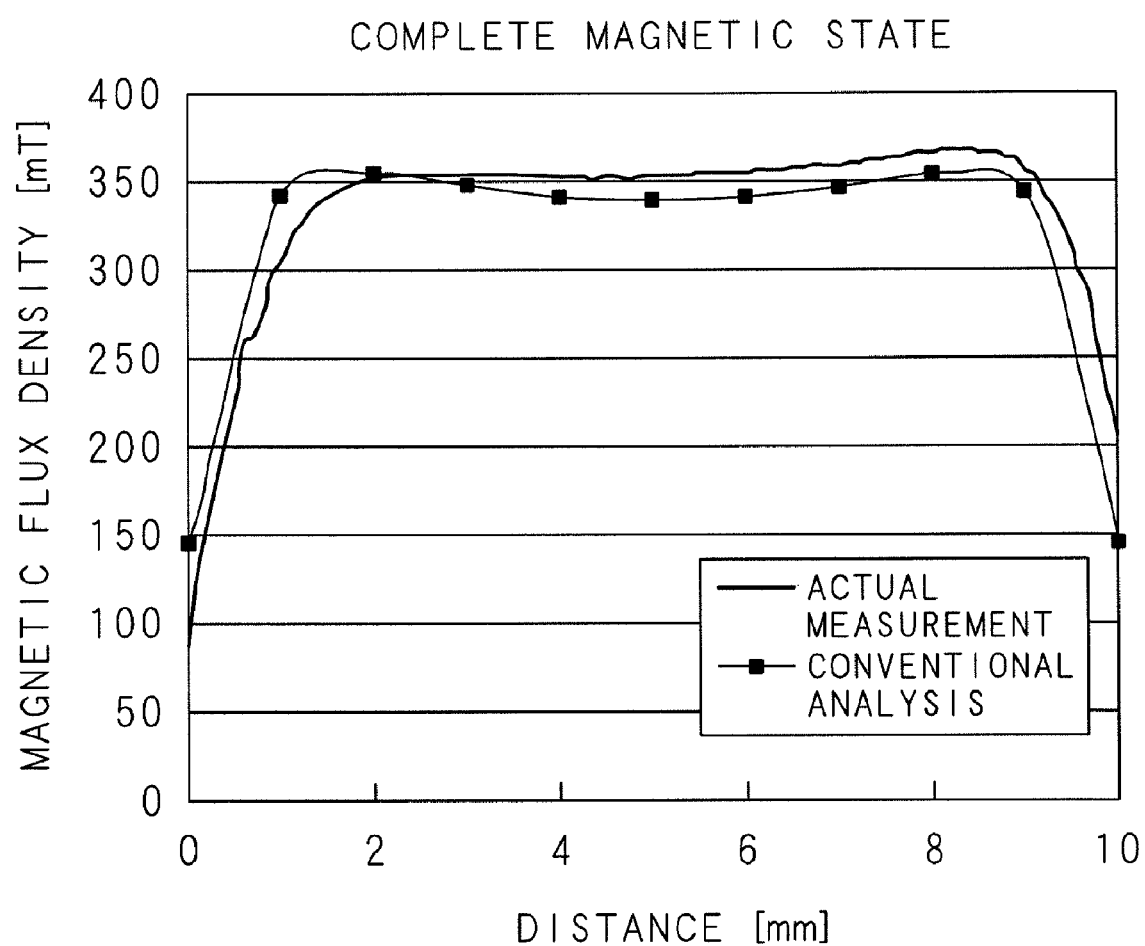
Figure 16:
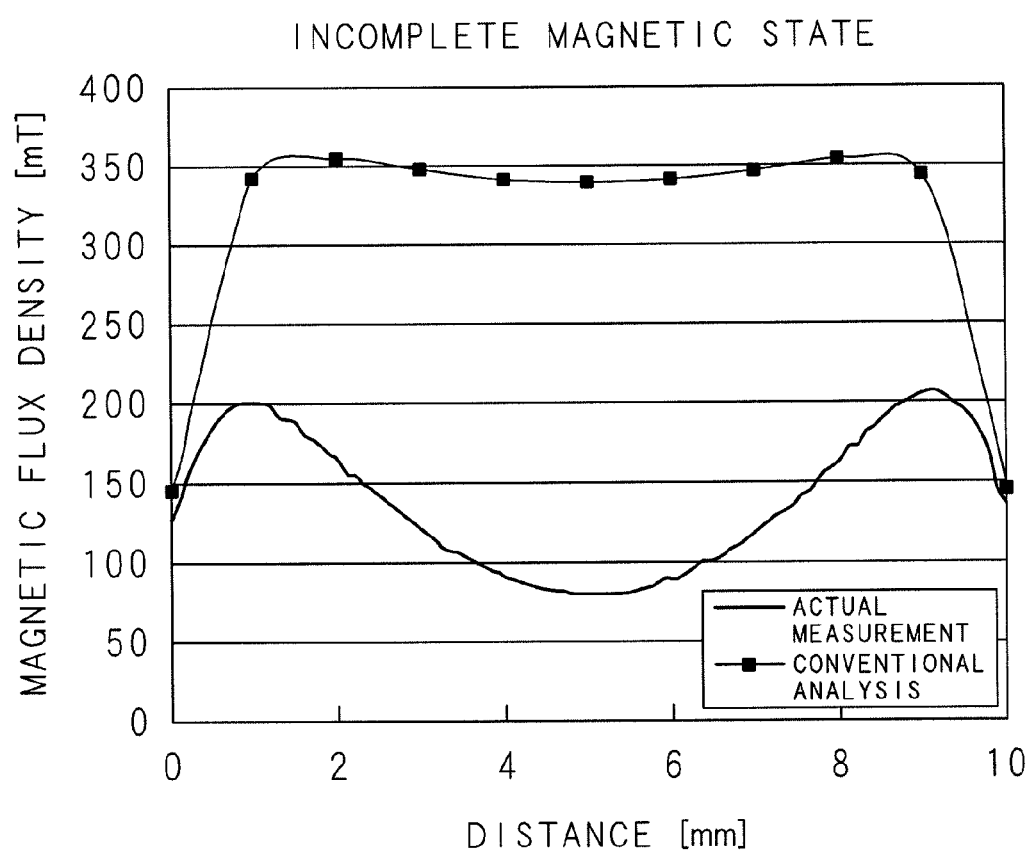
Figure 17:
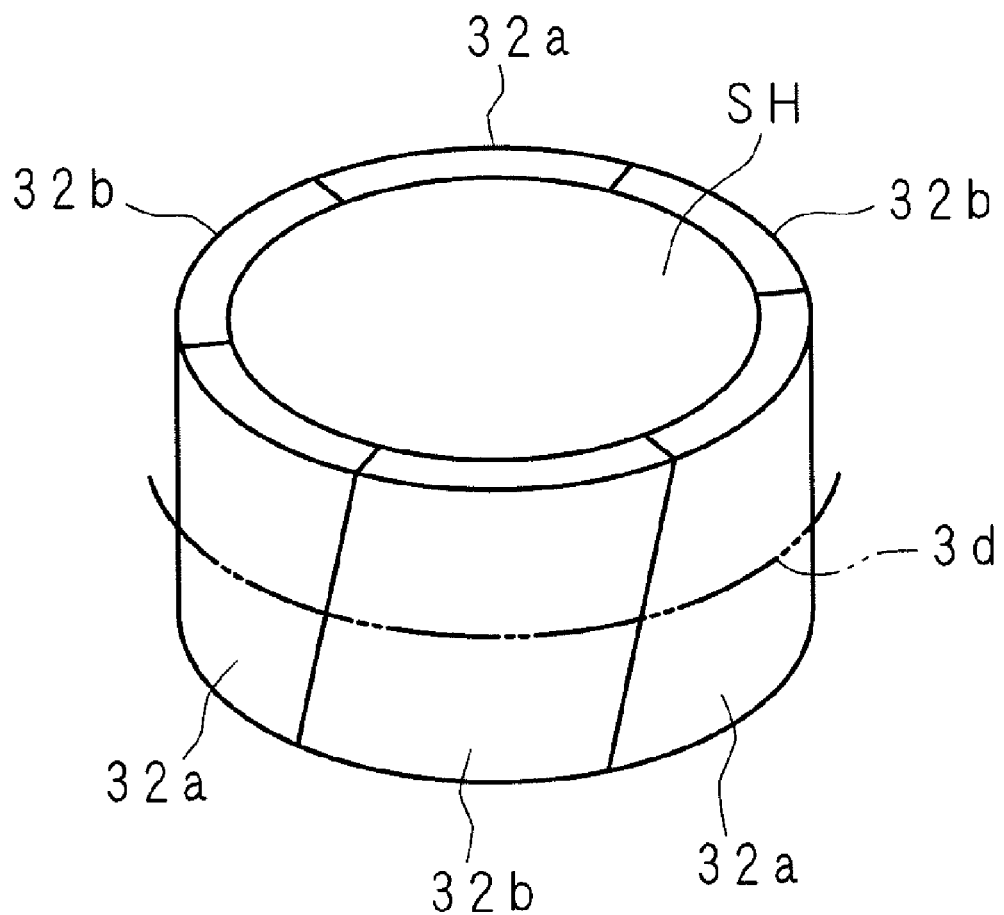
Figure 19:
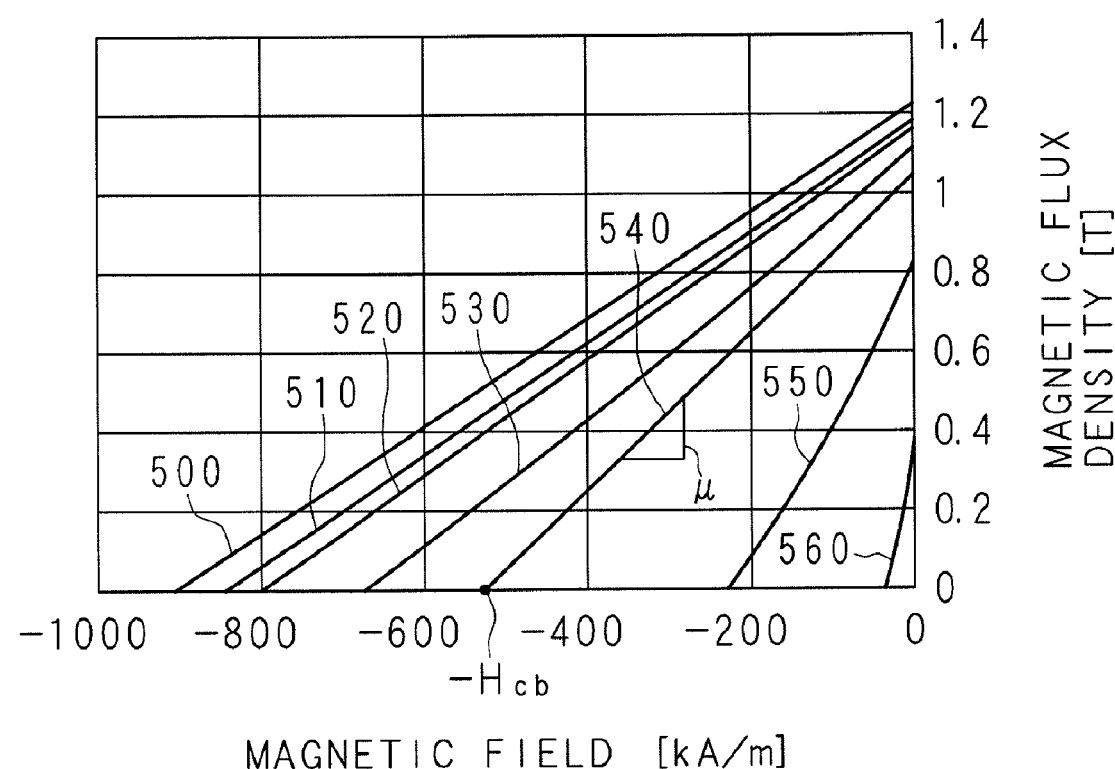
Figure 20:
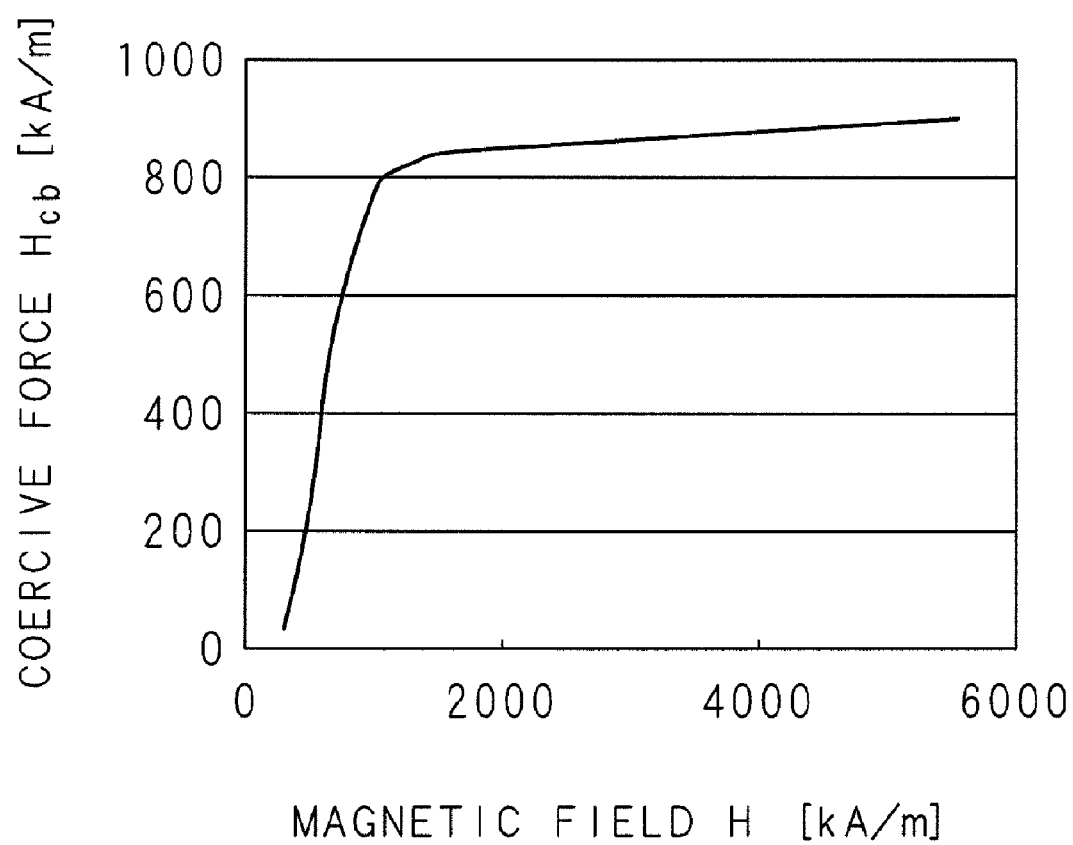
Figure 22:
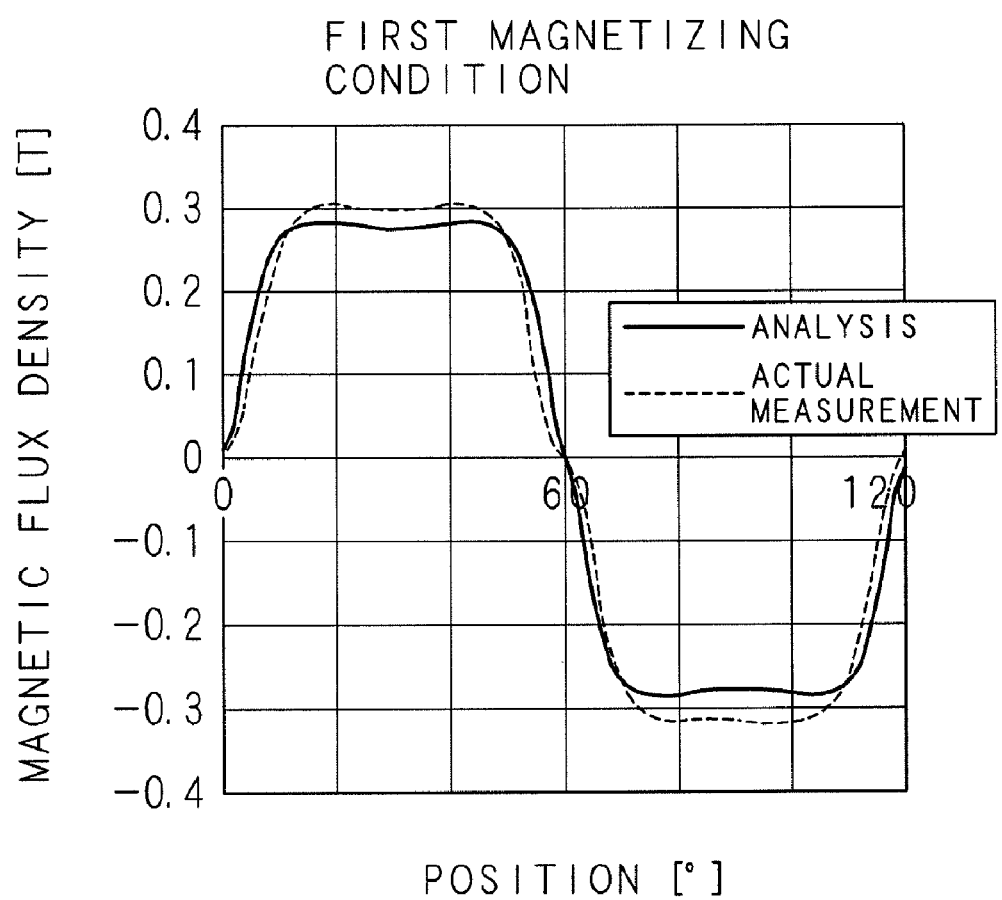
Figure 23:
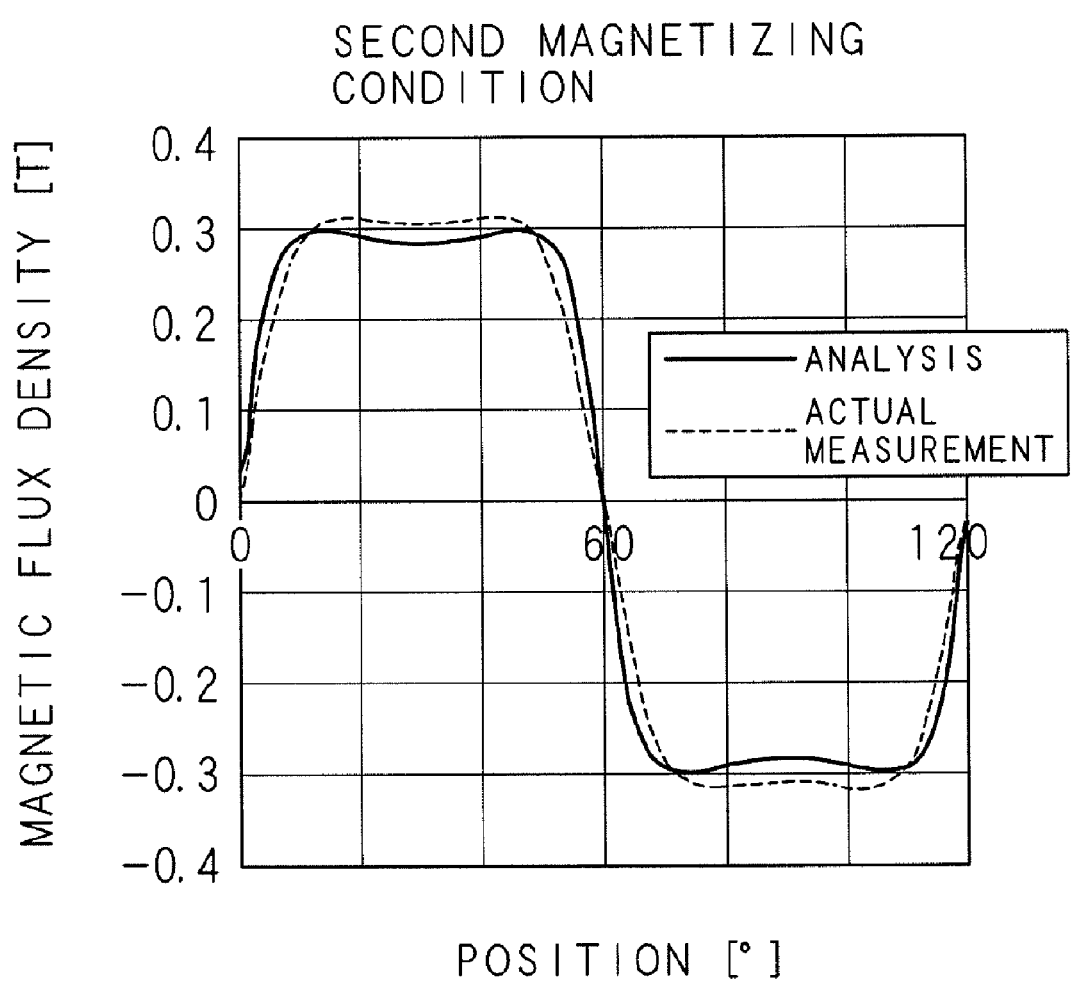
Figure 24:
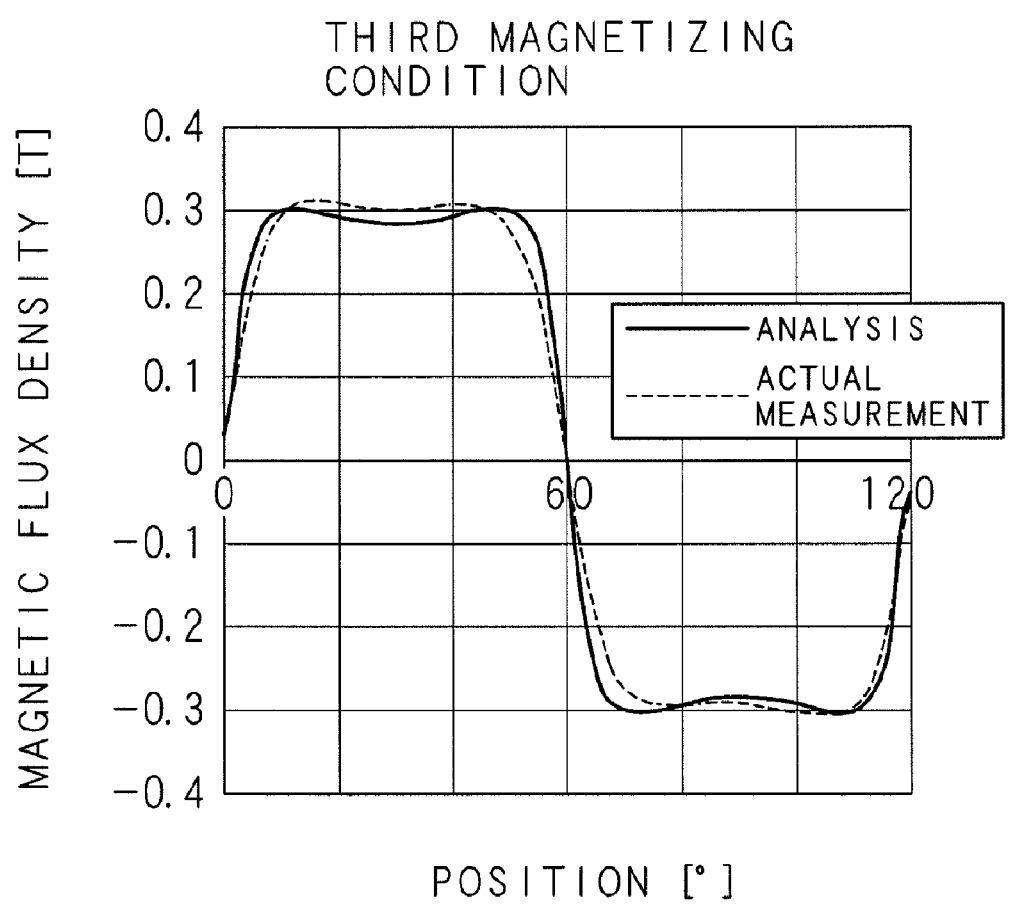
Figure 25:
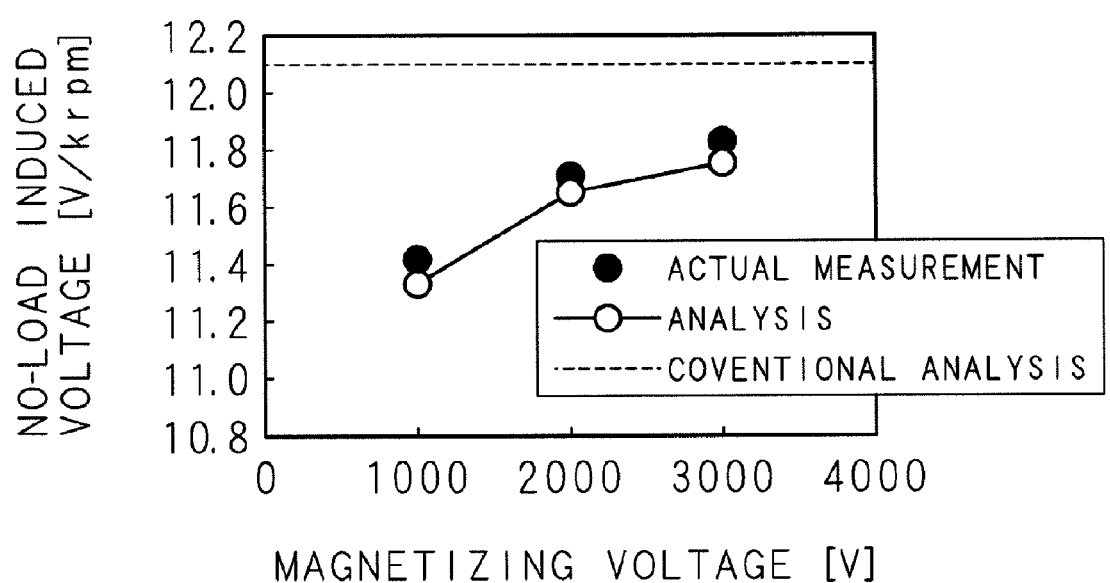

FIG. 14 is a characteristic view showing an analysis result of the permanent magnet with a magnetization rate of 50% that is calculated by the magnetization analysis according to the embodiment 1 of the present invention;

FIG. 15 is a characteristic view showing an analysis result of the permanent magnet in a complete magnetic state that is calculated by a conventional magnetic field analysis method;

FIG. 16 is a characteristic view showing an analysis result of the permanent magnet in an incomplete magnetic state that is calculated by a conventional magnetic field analysis method;

FIG. 17 is a schematic perspective view of a magnetic material to be made into a permanent magnet that is an analysis target of a magnetic field analysis method according to an embodiment 2 of the present invention;

FIG. 18 is a characteristic view showing an initial magnetization curve of the permanent magnet used in the magnetic field analysis method according to the embodiment 2 of the present invention;

FIG. 19 is a characteristic view showing a demagnetization curve used in the magnetic field analysis method according to the embodiment 2 of the present invention;

FIG. 20 is a characteristic view showing the relationship between a magnetizing magnetic field and a coercivity for each of the completely magnetized region and the incomplete magnetization region according to the embodiment 2 of the present invention;

FIG. 21 is a characteristic view showing the relationship between the magnetizing magnetic field and a recoil ratio permeability for each of the completely magnetized region and the incomplete magnetization region according to the embodiment 2 of the present invention;

FIG. 22 is a characteristic view showing an analysis result of the permanent magnet, under a first magnetizing condition, that is calculated by the magnetization analysis device according to the embodiment 2 of the present invention;

FIG. 23 a characteristic view showing an analysis result of the permanent magnet, under a second magnetizing condition, that is calculated by the magnetization analysis device according to the embodiment 2 of the present invention;

FIG. 24 a characteristic view showing an analysis result of the permanent magnet, under a third magnetizing condition, that is calculated by the magnetization analysis device according to the embodiment 2 of the present invention; and FIG. 25 is a characteristic view showing a no-load induced voltage of an electric motor comprising the permanent magnet obtained by magnetization under each of the first, second, and third magnetizing conditions.

DETAILED DESCRIPTION

The present invention will be described in detail hereinbelow on the basis of the drawings that show embodiments thereof.

(Embodiment 1)

Figure 1:
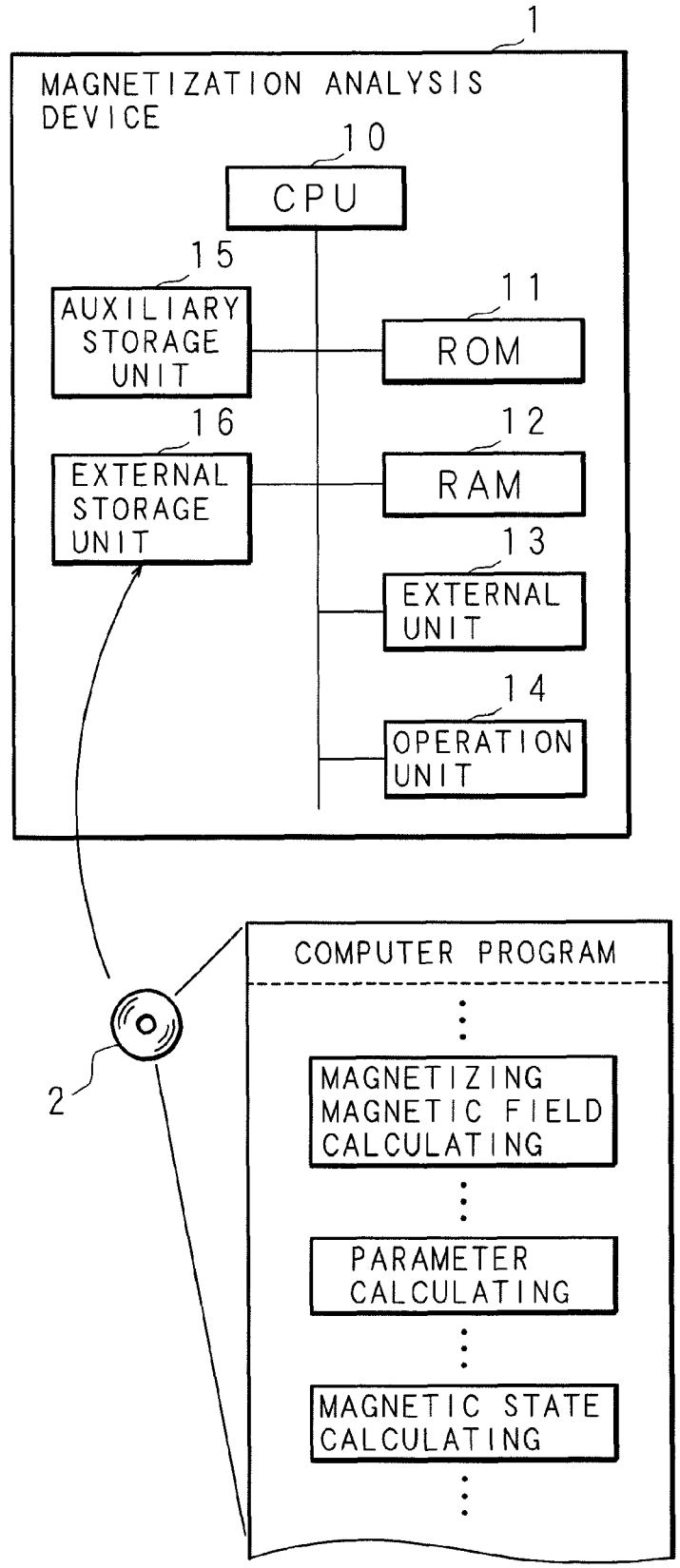
FIG. 1 is a block diagram showing a structure of a magnetization analysis device according to an embodiment 1 of the present invention.

FIG. 1 is a block diagram showing a structure of a magnetization analysis device 1 according to a first embodiment of the present invention.

The magnetization analysis device 1 consists of, e.g., a personal computer, and comprises a CPU 10, a ROM 11, a RAM 12, a display unit 13, an operation unit 14, an auxiliary storage unit 15, and an external storage unit 16. The individual components of the device are appropriately connected with each other via a bus, a signal line, or the like.

The display unit 13 consists of, e.g., a liquid crystal display, and is controlled by the CPU 10 to display a message representing the operation state of the magnetization analysis device 1, a message showing various instructions to a user, or the like.

The operation unit 14 consists of, e.g., a keyboard and a mouse.

Figure 9:
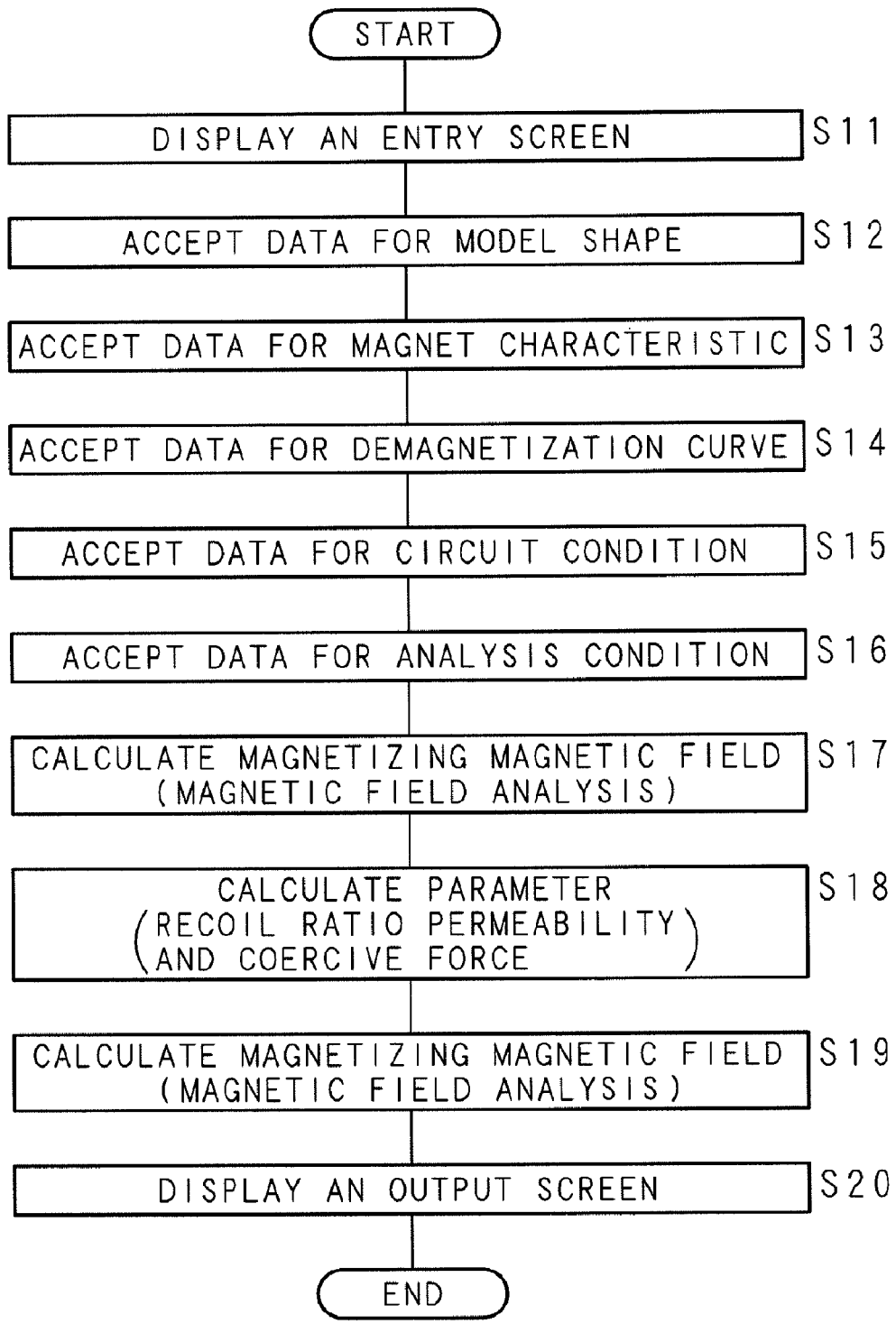
FIG. 9 is a flow chart showing the procedure for a magnetization analysis process executed by a CPU of the magnetization analysis device according to the embodiment 1 of the present invention.

The user of the magnetization analysis device 1 operates the operation unit 14 while monitoring the display unit 13, thereby inputting desired data to the magnetization analysis device 1 to cause the device to execute a magnetization analysis process (see FIG. 9).

The auxiliary storage unit 15 consists of, e.g., a hard disk, where the CPU 10 performs reading and writing of various computer programs, data, or the like.

The external storage unit 16 consists of, e.g., a CD-ROM drive, and is controlled by the CPU 10 to read a computer program, data, or the like from a portable recording medium (for example, a CD-ROM 2 storing therein a computer program of the present embodiment). The read computer program, data, or the like is written onto the auxiliary storage unit 15.

The CPU 10 serves as a center control of the magnetization analysis device 1, uses the RAM 12 as a work area, controls individual components of the device in accordance with the computer program, data or the like stored in the ROM 11 and/or the auxiliary storage unit 15, and then executes various processes.

More particularly, the CPU 10 executes the magnetization analysis process comprising a magnetizing magnetic field calculating process (see S17 in FIG. 9 described later), a parameter calculating process (see S18), a magnetic state calculating process (see S19), or the like in accordance with the computer program of the present embodiment comprising a magnetizing magnetic field calculating step, a parameter calculating step, a magnetic state calculating step, or the like, whereby the personal computer functions as the magnetization analysis device 1 according to the present embodiment.

A description will be given hereinbelow to a magnetic field analysis method in the present embodiment.

Figure 2:
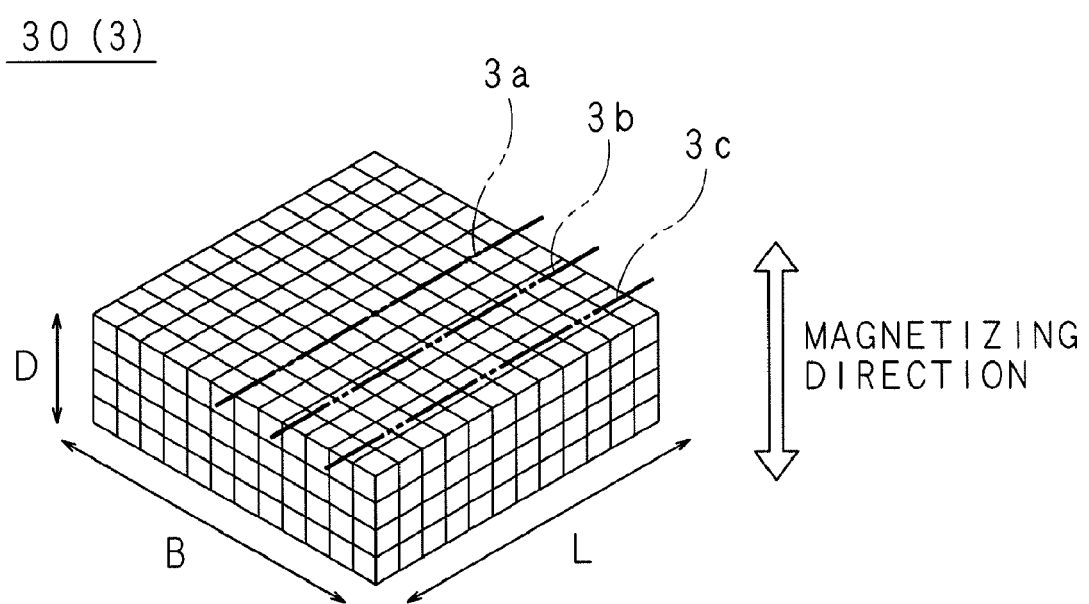
FIG. 2 is a schematic perspective view of a magnetic material to be made into a permanent magnet that is an analysis target of a magnetic field analysis method according to the embodiment 1 of the present invention.
Figure 3:
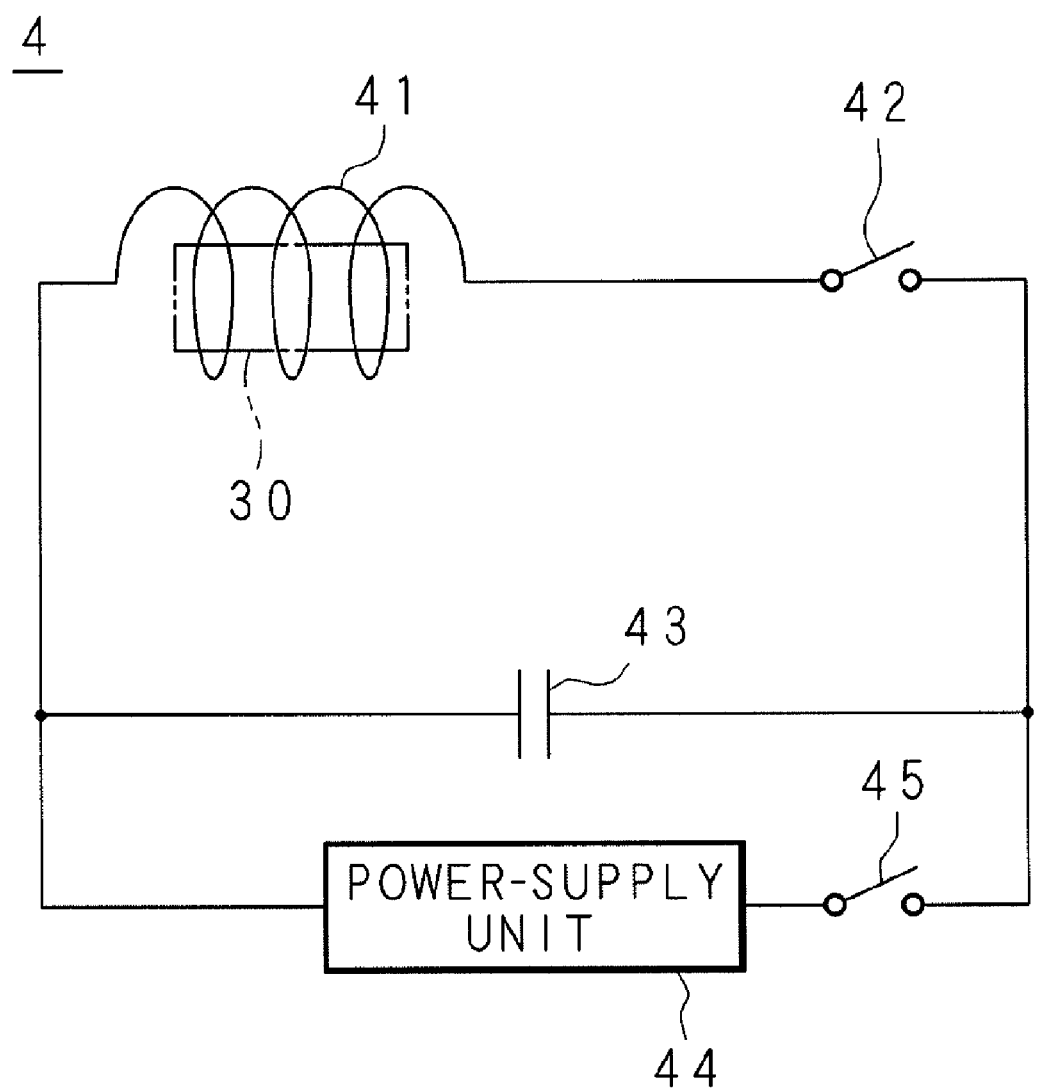
FIG. 3 is a circuit diagram showing a principal portion of a magnetizer which magnetizes the magnetic material to be made into the permanent magnet as an analysis target of the magnetic field analysis method according to the embodiment 1 of the present invention by applying a magnetic field thereto.

FIG. 2 is a schematic perspective view of a magnetic material 30 to be made into a permanent magnet 3 as an analysis target of the magnetic field analysis method according to the embodiment 1 of the present invention. FIG. 3 is a circuit diagram showing a principal portion of a magnetizer 4 that magnetizes the magnetic material 30 by applying a magnetic field thereto.

Figure 4:
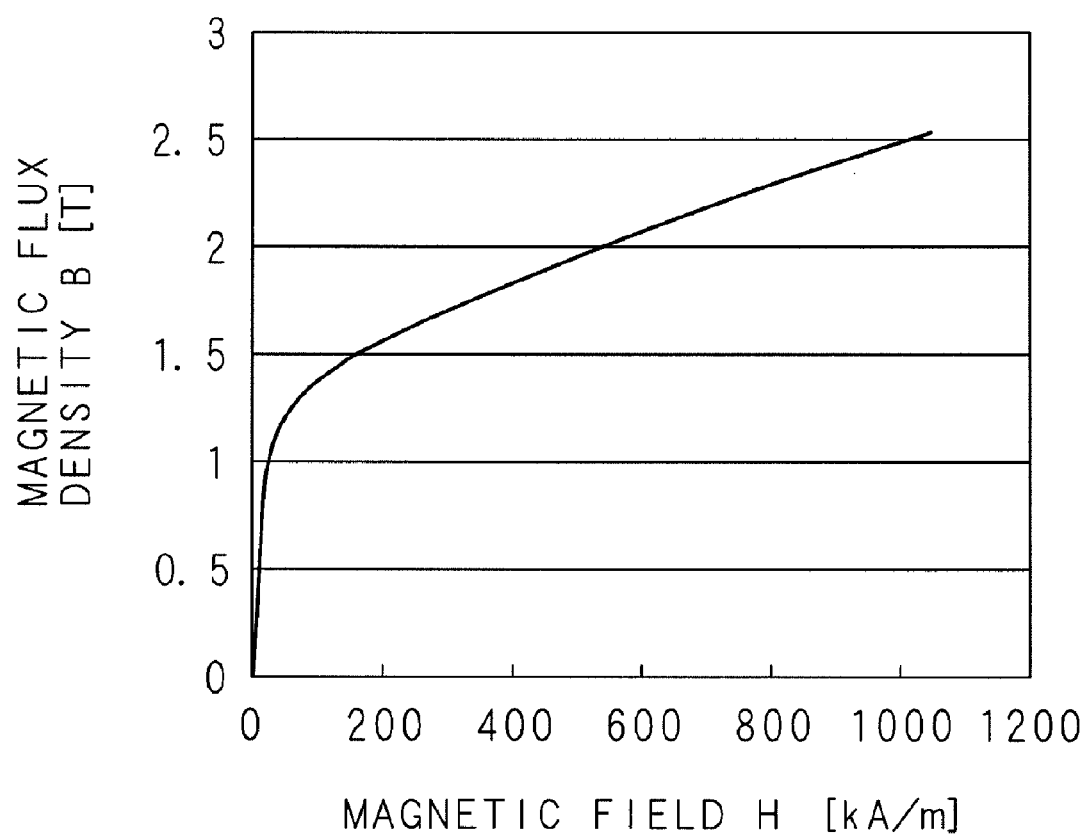
FIG. 4 is a characteristic view showing an initial magnetization curve of the permanent magnet used in the magnetic field analysis method according to the embodiment 1 of the present invention.

FIG. 4 is a characteristic view showing an initial magnetization curve of the permanent magnet 3 used in the magnetic field analysis method according to the embodiment 1 of the present invention, in which the horizontal axis represents a magnetic field H [kA/m] and the vertical axis represents a flux density B [T].

In the present embodiment, the magnetic material 30 is made into the permanent magnet 3 with a magnetizing direction corresponding to the direction of a hollow arrow mark shown in FIG. 2 by the magnetizer 4, and the comparison is performed between a magnetic flux density distribution on the magnet surface that is actually measured by measurement equipment (e.g., a gauss meter) which is not shown (i.e., the actual measurement result) and a magnetic flux density distribution on the magnet surface that is calculated by the magnetization analysis device 1 (i.e., the analysis result) for each of portions (specifically, each of first, second, and third noted portions 3a, 3b, and 3c shown in FIG. 2) on the surface of the permanent magnet 3.

Hereinafter the magnetic flux density distribution on the surface of the magnet is referred to as a magnetic flux distribution.

As shown in FIG. 2, the magnetic material 30 (and the permanent magnet 3 obtained by magnetizing the material) is in the shape of a rectangular parallelepiped with a longitudinal length L of 10 [mm], a lateral width B of 10 [mm], and a thickness D of 4 [mm].

The noted portions 3a, 3b, and 3c of the permanent magnet 3 relate to surfaces of the longitudinal length L×the lateral width B of the permanent magnet 3, and are linear portions continuously extending from one end (e.g., the position at 0 [mm] shown in FIG. 10) to the other end (e.g., the position at 10 [mm]) in the direction of the longitudinal length L. More particularly, the first noted portion 3a is located at the central position in the direction of the lateral width B of the permanent magnet 3, the third noted portion 3c is located in one end portion in the direction of the lateral width B of the permanent magnet 3, and the second noted portion 3b is located in the middle portion between the first noted portion 3a and the third noted portion 3c.

The magnetic material 30 is an anisotropic magnetic material comprising a rare earth element, and the resistance value of the magnetic material 30 is $144 \times 10^{-8}$ [Ω·m].

Further, the magnetization characteristic of the magnetic material 30, is nonlinear, and the initial magnetization curve as shown in FIG. 4, e.g., is data to show the magnetization characteristic.

There is no problem to use an initial magnetization curve obtained by actually measuring a magnetic material that is the same type as the magnetic material 30, although the initial magnetization curve in the present embodiment is obtained by actually measuring in advance the magnetic material 30 to be made into the permanent magnet 3 as an analysis target, and corresponds to the applied magnetizing magnetic field.

The material, the resistance value, and the initial magnetization curve of the magnetic material 30 are used as magnet parameters (hereinafter referred to as a magnet characteristic) inherent to the magnetic material 30 when the magnetic field analysis process (see S17 and/or S19 shown in FIG. 9) is performed, as will be described later.

As shown in FIG. 3, the magnetizer 4 is configured so that an air core coil 41 having a required size, a switch 42, and a capacitor 43 with a large capacitance are connected in series.

Each of a power-supply unit 44 and a switch 45 is connected with the capacitor 43 in parallel, and a large amount of charges are stored in the capacitor 43 with the power supplied from the power-supply unit 44.

The magnetic material 30 to be made into the permanent magnet 3 is disposed at the interior center of the air core coil 41.

By concurrently inverting the polarities of the switches 42 and 45, after turning OFF the switch 42 and ON the switch 45 to store a large amount of charges in the capacitor 43, a large pulse current is caused to flow from the capacitor 43 to the air core coil 41. Then, an extremely large magnetic field generated in the air core coil 41 is applied to the magnetic material 30 so that the magnetic material 30 is magnetized to be the permanent magnet 3.

It is assumed herein that the number of turns of the air core coil 41 is 45 [turn], the resistance value of the air core coil 41 is 45.28 [mΩ], the electrostatic capacitance of the capacitor 43 is 3375 [µF], the voltage at both ends of the capacitor 43 (i.e., a magnetizing voltage) is 500 V, and the internal resistance value of the magnetizer 4 is 72 [mΩ].

The number of turns and the resistance value of the air core coil 41, the electrostatic capacitance and the magnetizing voltage of the capacitor 43, and the internal resistance value of the magnetizer 4 are used as magnetizer parameters (hereinafter referred to as a circuit condition) inherent to the magnetizer 4 when the magnetization analysis is performed, as will be described later.

In the magnetization analysis, various methods such as a finite element method, an integral element method, and the like can be used. In the case of, e.g., the finite element method, a mesh division model is produced to perform a transient response analysis.

In this case, the mesh division model is produced in correspondence to the shape and size of the air core coil 41 and, in addition, the mesh division model is produced in further correspondence to the shape and size of the magnetic material 30 (which will be the permanent magnet 3) (see FIG. 2).

The shape and size of the air core coil 41, the shape and size of the magnetic material 30 (i.e., the shape and size of the permanent magnet 3), and the mesh division models in correspondence thereto (hereinafter referred to as a model shape) are used for the magnetization analysis, as will be described later.

FIG. 5 is a characteristic view showing each of demagnetization curves 50 to 56 used in the magnetic field analysis method according to the embodiment 1 of the present invention. The demagnetization curve 50 relates to the completely magnetized region. Each of the demagnetization curves 51 to 56 relates to the incomplete magnetization region and is obtained by actually measuring in advance.

Figure 6:
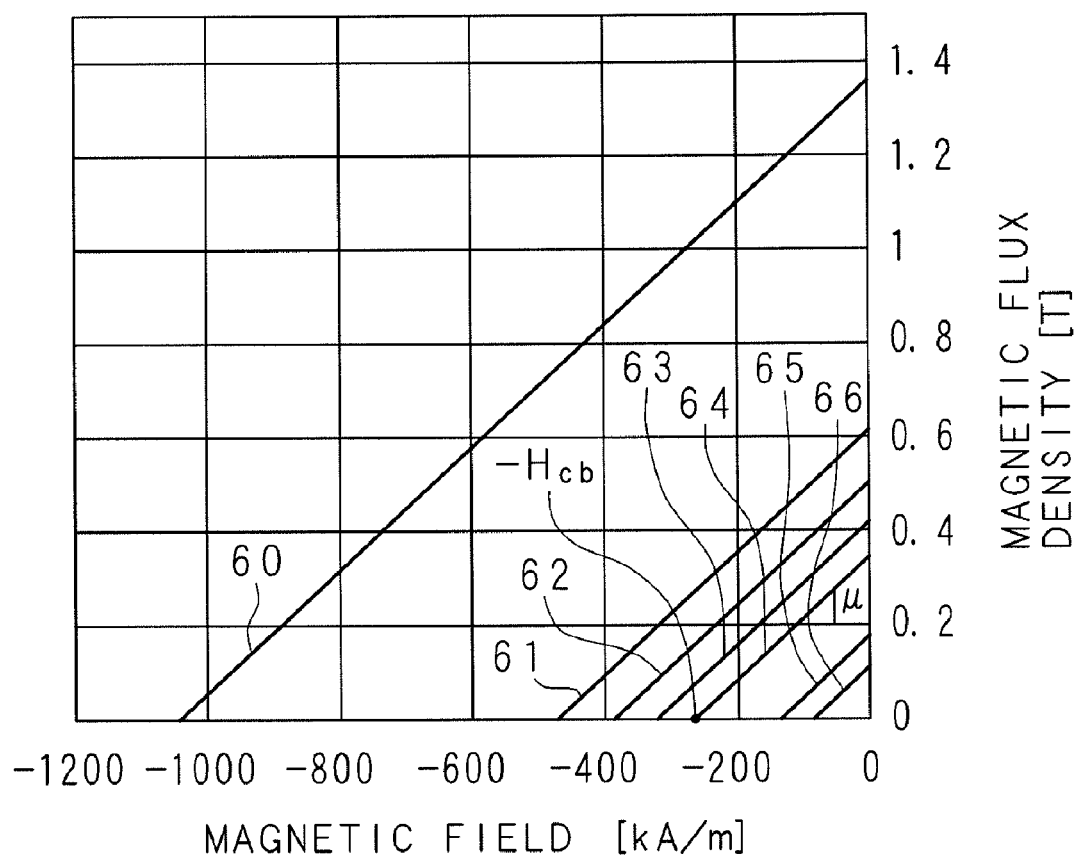
FIG. 6 is a characteristic view in which the demagnetization curve of an incomplete magnetization region is represented by a similar figure of the demagnetization curve of a completely magnetized region in accordance with a conventional method.

FIG. 6 is a characteristic view in which demagnetization curves 61 to 66 related to the incomplete magnetization region are represented by a similar figure of a demagnetization curve 60 related to the completely magnetized region, i.e., by a conventional method.

In each of FIGS. 5 and 6, the horizontal axis represents the magnetic field H [kA/m], while the vertical axis represents the remanence B [T].

Each of the demagnetization curves 51 to 56 shown in FIG. 5 is obtained by the actual measurement using the magnetic material 30 to be made into the permanent magnet 3 as an analysis target. Specifically, the demagnetization curves are obtained by the actual measurements of the permanent magnet in an incomplete magnetic state after applying each of magnetizing magnetic fields of 1257, 1019, 859, 700, 533, or 366 [kA/m] to the magnetic material 30 (i.e., magnetic fields applied by the magnetizer 4), and then correspond to the applied magnetizing magnetic fields.

However, there is no problem to use demagnetization curves obtained by actually measuring a magnetic material that is the same type as the magnetic material 30. In this case, the demagnetization curves can be obtained which are substantially similar to the demagnetization curves 51 to 56, respectively.

The demagnetization curves 50 and 60 shown in FIGS. 5 and 6 are the demagnetization curves related to the completely magnetized region of the permanent magnet obtained by applying the magnetizing magnetic field of 2777 [kA/m] to the magnetic material 30, and the demagnetization curves 50 and 60 coincide with each other.

Based on the demagnetization curves described above, a coercivity $H_{cb}$ and a recoil ratio permeability µ are calculated. FIGS. 5 and 6 show the coercivity $H_{cb}$ (more precisely, a negative number of the coercivity "$-H_{cb}$") and the recoil ratio permeability µ that relate to each of the demagnetization curves 54 and 64.

The negative number of the coercivity "$-H_{cb}$" is a value at an intersection point of the demagnetization curve and the horizontal axis. The recoil ratio permeability µ corresponds to a gradient of the demagnetization curve. The recoil ratio permeability $\mu$ and the coercivity $H_{cb}$ are parameters that approximately represent demagnetization characteristics.

Figure 7:
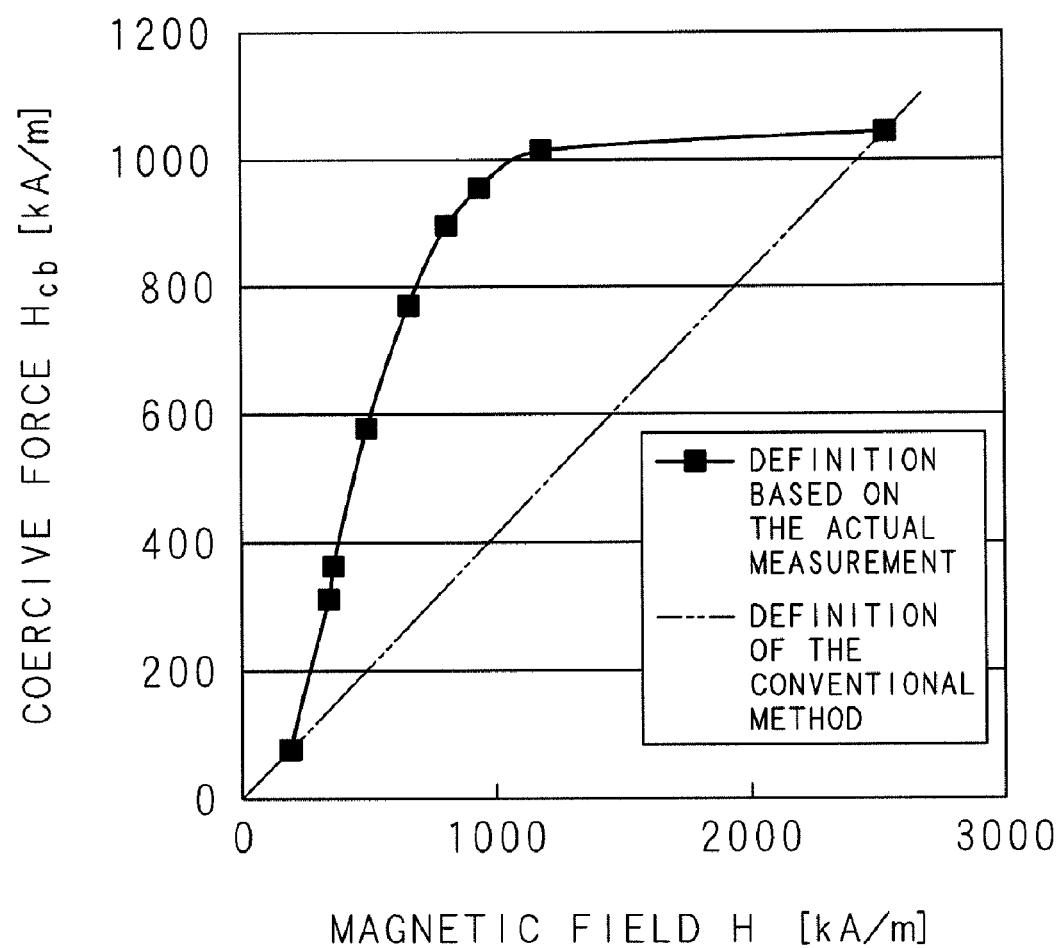
FIG. 7 is a characteristic view showing the relationship between a magnetizing magnetic field and a coercivity for each of the completely magnetized region and the incomplete magnetization region according to the embodiment 1 of the present invention.

FIG. 7 is a characteristic view showing the relationship between the magnetizing magnetic field H and the coercivity $H_{cb}$ that relate to each of the completely magnetized region and the incomplete magnetization region. The horizontal axis represents the magnetizing magnetic field H [kA/m], and the vertical axis represents the coercivity $H_{cb}$ [kA/m].

Figure 8:
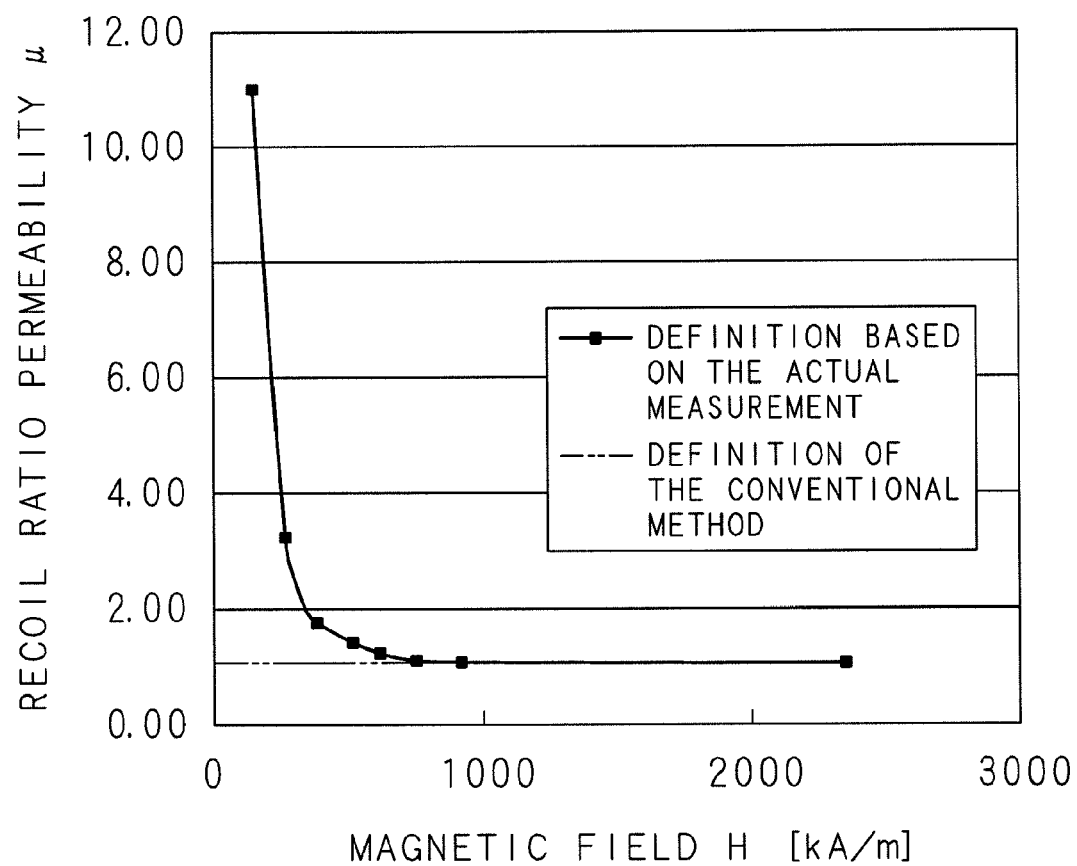
FIG. 8 is a characteristic view showing the relationship between the magnetizing magnetic field and a recoil ratio permeability for each of the completely magnetized region and the incomplete magnetization region according to the embodiment 1 of the present invention.

FIG. 8 is a characteristic view showing the relationship between the magnetizing magnetic field H and the recoil ratio permeability $\mu$ that relate to each of the completely magnetized region and the incomplete magnetization region. The horizontal axis represents the magnetizing magnetic field H [kA/m], and the vertical axis represents the recoil ratio permeability $\mu$.

In each of FIGS. 7 and 8, a graph, indicated by plots (black square mark) and a solid line, corresponds to the definition of the demagnetization curve based on the actual measurement shown in FIG. 5, and a graph, indicated by a two-dot dash line, corresponds to the definition of the conventional method shown in FIG. 6.

As shown in FIG. 5, each of the actually measured demagnetization curves 51, 52, 53, 54, 55, and 56 is defined as a nonlinear characteristic in which the gradient (i.e., the recoil ratio permeability $\mu$) increases as the magnitude of the magnetizing magnetic field H decreases, and a value at an intercept of the horizontal axis (i.e., the negative number of the coercivity "$-H_{cb}$") increases as the magnitude of the magnetizing magnetic field H decreases.

Therefore, as shown in FIG. 7, the coercivity $H_{cb}$ in correspondence to the magnetizing magnetic fields H of 0 [kA/m] to 1592 [kA/m] (i.e., the coercivity $H_{cb}$ for the incomplete magnetization region) sharply increases, as the magnitude of the magnetizing magnetic field H increases. The coercivity $H_{cb}$ in correspondence to the magnetizing magnetic field H of not less than 1592 [kA/m] (i.e., the coercivity $H_{cb}$ for the completely magnetized region) slowly increases.

Further, as shown in FIG. 8, the recoil ratio permeability $\mu$ in correspondence to the magnetizing magnetic fields H of 0 [kA/m] to 1592 [kA/m] (i.e., the recoil ratio permeability $\mu$ for the incomplete magnetization region) sharply decreases, as the magnitude of the magnetizing magnetic field H increases. The recoil ratio permeability $\mu$ in correspondence to the magnetizing magnetic field H of not less than 1592 [kA/m] (i.e., the recoil ratio permeability $\mu$ for the completely magnetized region) is substantially constant.

On the other hand, as shown in FIG. 6, each of the demagnetization curves 61, 62, 63, 64, 65, and 66 defined by the conventional method has a linear characteristic, the same gradient as that of the demagnetization curve 60 (i.e., the recoil ratio permeability p), and a value at an intercept of the horizontal axis (i.e., the negative number of the coercivity "$-H_{cb}$") that increases as the magnitude of the magnetizing magnetic field H decreases. Thus, the demagnetization curves 61, 62, 63, 64, 65, and 66 are considerably different from the actually measured demagnetization curves 51 to 56 shown in FIG. 5.

Therefore, as shown in FIG. 7, the coercivity $H_{cb}$ increases in a direct proportion to the magnitude of the magnetizing magnetic field H. In addition, as shown in FIG. 8, the recoil ratio permeability $\mu$ remains constant even though the magnitude of the magnetizing magnetic field H increases.

The coercivity $H_{cb}$ and the recoil ratio permeability $\mu$, calculated on the basis of the demagnetization curves 51 to 56 shown in FIG. 5, i.e., the demagnetization curves 51 to 56 actually measured in advance for the incomplete magnetization region, approximately represent the demagnetization characteristic of the incomplete magnetization region and reflect the magnetic state of the incomplete magnetization region.

Consequently, in the present embodiment, the coercivity $H_{cb}$ and the recoil ratio permeability $\mu$ are used as region parameters for the incomplete magnetization region of the permanent magnet 3.

Next, a description will be given to a specific procedure for calculation by the magnetization analysis device 1.

FIG. 9 is a flow chart showing the procedure for a magnetization analysis process executed by the CPU 10 of the magnetization analysis device 1.

The CPU 10 causes the display unit 13 to display an entry screen for an operator to enter desired data (S11).

Subsequently, the CPU 10 accepts data for the model shape (S12), accepts data for the magnet characteristic (S13), accepts data for the demagnetization curve (S14), accepts data for the circuit condition (S15), and accepts data for an analysis condition such as a nonlinear repetitive calculation condition or the like (S16). With regard to S12 to S15, the CPU 10 causes the auxiliary storage unit 15 to store the accepted various data, i.e., data entered by the operator.

Before the execution of the magnetization analysis process by the CPU 10, the operator carries out an actual measurement operation with the magnetic material 30 to prepare data for the initial magnetization curve and the demagnetization curve, or prepares data for the initial magnetization curve and the demagnetization curve that are obtained by actual measurement in advance.

Next, the operator produces a mesh division model in correspondence to the shape and size of the air core coil 41, and further produces a mesh division model in correspondence to the shape and size of the magnetic material 30.

The operator enters the produced data of the mesh division models, data of each of the shape and the size of the air core coil 41, and data of each of the shape and the size of the permanent magnet 3 into the magnetization analysis device 1 as data of the model shape.

It is to be noted that the magnetization analysis device 1 may be configured to generate the data of the mesh division model in accordance with the shape and size of the air core coil 41, the shape and size of the magnetic material 30, or the like, instead of entering the data of the mesh division model from the outside.

Subsequently, the operator enters data for a material of the magnetic material 30, data for the resistance value of the magnetic material 30, and data for the initial magnetization curve of the magnetic material 30 that are the magnet parameters inherent to the magnetic material 30, into the magnetization analysis device 1 as data for the magnet characteristic.

The operator also enters data of the actually measured demagnetization curve in the magnetization analysis device 1.

The operator further enters data for the number of turns and the resistance value of the air core coil 41, data for the electrostatic capacitance and the magnetizing voltage of the capacitor 43, and data for the internal resistance value of the magnetizer 4 that are the magnetizer parameters inherent to the magnetizer 4, into the magnetization analysis device 1 as data for the circuit condition.

Then, the operator enters the nonlinear repetitive calculation condition or the like into the magnetization analysis device 1.

The entry of various data described above is manually carried out by the operator with the use of the operation unit 14, or by the external storage unit 16 that reads data stored in a recording medium. It is to be noted that the magnetization analysis device 1 may be configured to entry the data by selecting data pre-stored in the auxiliary storage unit 15, by downloading from a network that is not shown, or the like.

When the acceptance of various data is completed in each of S12 to S16, the CPU 10 performs the magnetic field analysis by the finite element method with the suitable use of the data for the magnetizer parameters inherent to the magnetizer 4, the data for the magnet parameters inherent to the magnetic material 30, the data for the mesh division models, or the like, among the accepted data. Then, the magnetizing magnetic field is calculated that is applied to each mesh element of the mesh division model for the magnetic material 30 (S17). The procedure for the magnetic field analysis in S17 is substantially similar to the procedure for the conventional magnetic field analysis, and the calculated magnetizing magnetic field is stored in the auxiliary storage unit 15.

Next, the CPU 10 calculates the region parameters for the incomplete magnetization region of the permanent magnet 3 for each mesh element on the basis of the calculation result of the magnetizing magnetic field for each mesh element that is obtained in S17, and the accepted data of the demagnetization curve in S14 (S18). Specifically, the region parameters calculated in S18 are the recoil ratio permeability $\mu$ and the coercivity $H_{cb}$ that are obtained on the basis of the demagnetization curve corresponding to the magnetizing magnetic field which is applied to each mesh element. The calculated region parameters are stored in the auxiliary storage unit 15.

The CPU 10 further performs the magnetic field analysis with the use of the recoil ratio permeability $\mu$ and the coercivity $H_{cb}$ for each mesh element which are obtained in S18. The state parameters that represent the magnetic state of the permanent magnet 3 (S19) are calculated. The state parameters calculated in S19 are the remanence B and the magnetic field H for each mesh element of the mesh division models or the like. The calculated state parameters are stored in the auxiliary storage unit 15. The procedure for the magnetic field analysis in S19 is substantially similar to the procedure for the conventional magnetic field analysis.

Finally, the CPU 10 causes the display unit 13 to display an output screen that is obtained by editing the state parameters calculated in S19 into a predetermined format (S20), and then ends the magnetization analysis process.

In S20, the CPU 10 calculates the remanence B for each of the first, second, and third noted portions 3a, 3b, and 3c (see FIG. 2) on the basis of the state parameters calculated in S19. Then the CPU 10 causes the display unit 13 to display a graph of the magnetic flux distribution for each of the noted portions 3a, 3b, and 3c. In the present embodiment, the magnetic flux distribution is the analysis result.

It is also possible to cause the auxiliary storage unit 15 to store data of an actually measured magnetic flux distribution (i.e., the actual measurement result) for each of the noted portions 3a, 3b, and 3c, in advance. It may be configured to perform the comparison between the analysis result and the actual measurement result by concurrently displaying the data on the output screen.

In the magnetization analysis process described above, the magnetization analysis device 1 analyzes the magnetic state of the permanent magnet 3 that is obtained by magnetizing the magnetic material 30 with the magnetizer 4 which magnetizes the magnetic material 30 by applying the magnetic field thereto.

In addition, the CPU 10 in S17 functions as a magnetizing magnetic field calculating means that calculates the applied magnetizing magnetic field to each portion of the magnetic material 30 by performing the magnetic field analysis with the use of the magnetizer parameters corresponding to the magnetizer 4 and the magnet parameters corresponding to the magnetic material 30.

Further, the CPU 10 in S18 functions as a parameter calculating means that calculates the region parameters for the incomplete magnetization region of the permanent magnet 3 to be analyzed for each portion of the magnetic material 30 on the basis of the calculation result by the magnetizing magnetic field calculating means and the obtained demagnetization curve by actually measuring each portion of the incomplete magnetization region of the permanent magnet in advance that corresponds to the applied magnetizing magnetic field. The CPU 10 uses the recoil ratio permeability $\mu$ and the coercivity $H_{cb}$ which approximately represent the demagnetization characteristic of the incomplete magnetization region as the region parameters for the incomplete magnetization region of the permanent magnet 3 to be analyzed, herein.

Furthermore, the CPU 10 in S19 functions as a magnetic state calculating means that calculates the state parameters representing the magnetic state of the permanent magnet 3 to be analyzed by performing the magnetic field analysis with the use of the calculation result by the parameter calculating means.

Figure 10:
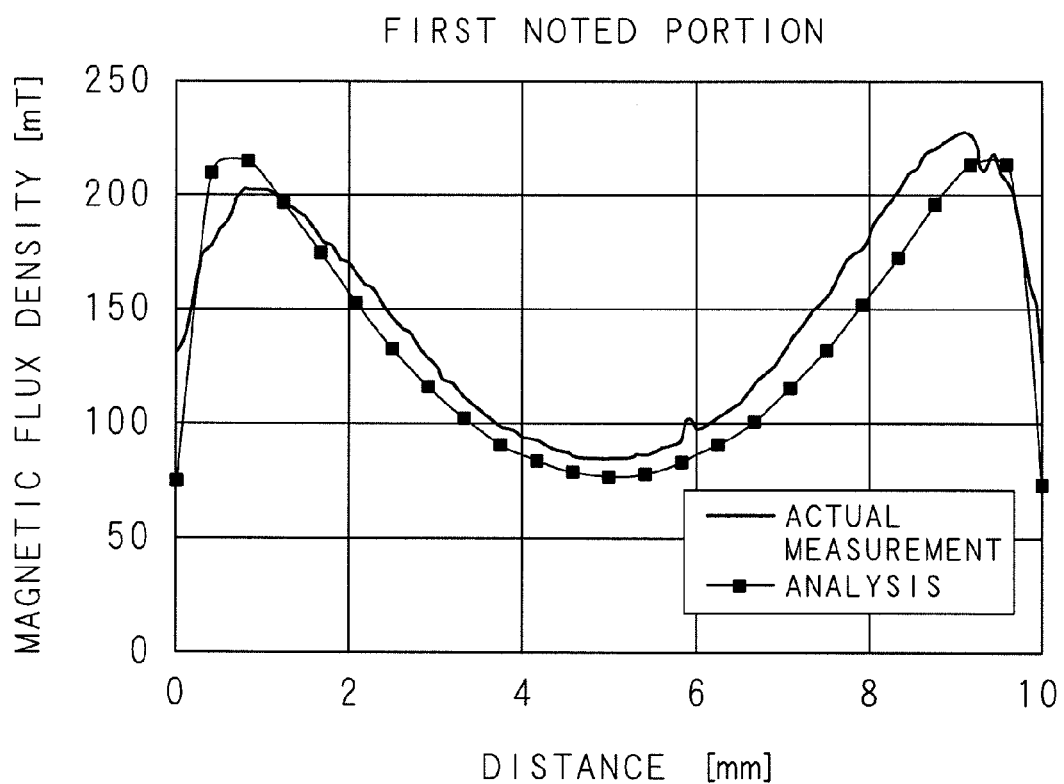
FIG. 10 is a characteristic view showing an analysis result corresponding to a first noted portion of the permanent magnet in an incomplete magnetic state that is calculated by the magnetization analysis device according to the embodiment 1 of the present invention.
Figure 11:
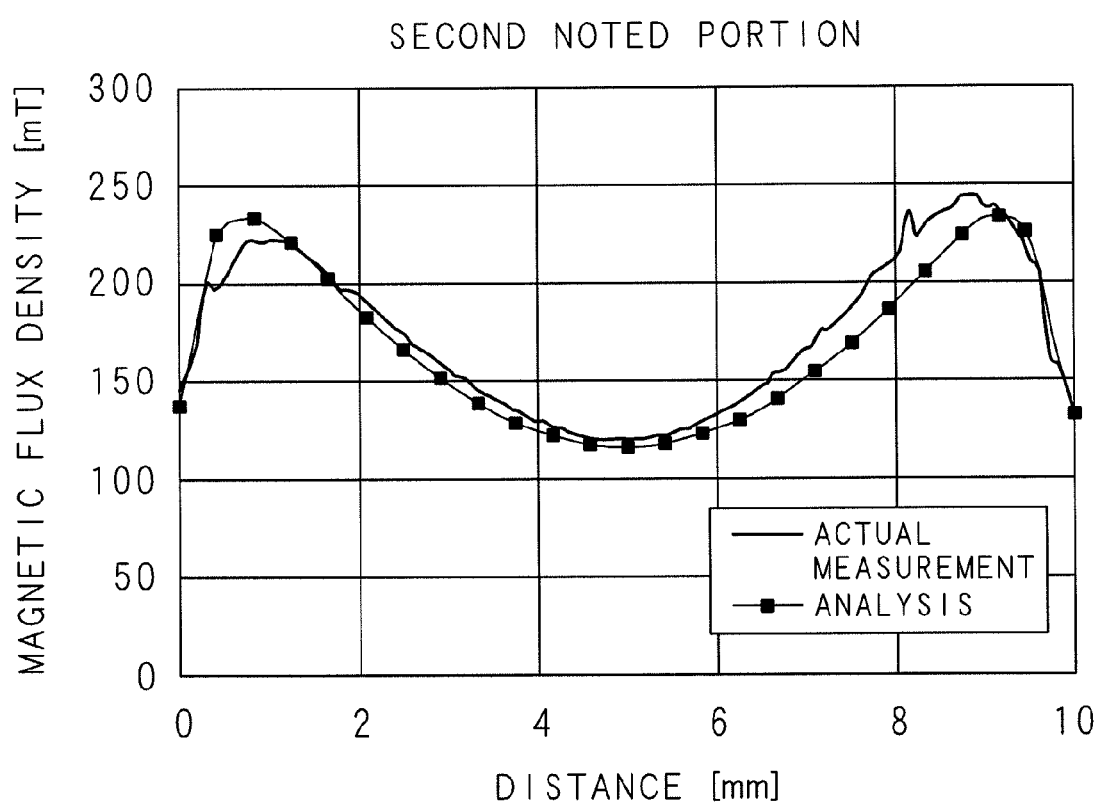
FIG. 11 is a characteristic view showing an analysis result corresponding to a second noted portion of the permanent magnet in an incomplete magnetic state that is calculated by the magnetization analysis device according to the embodiment 1 of the present invention.
Figure 12:
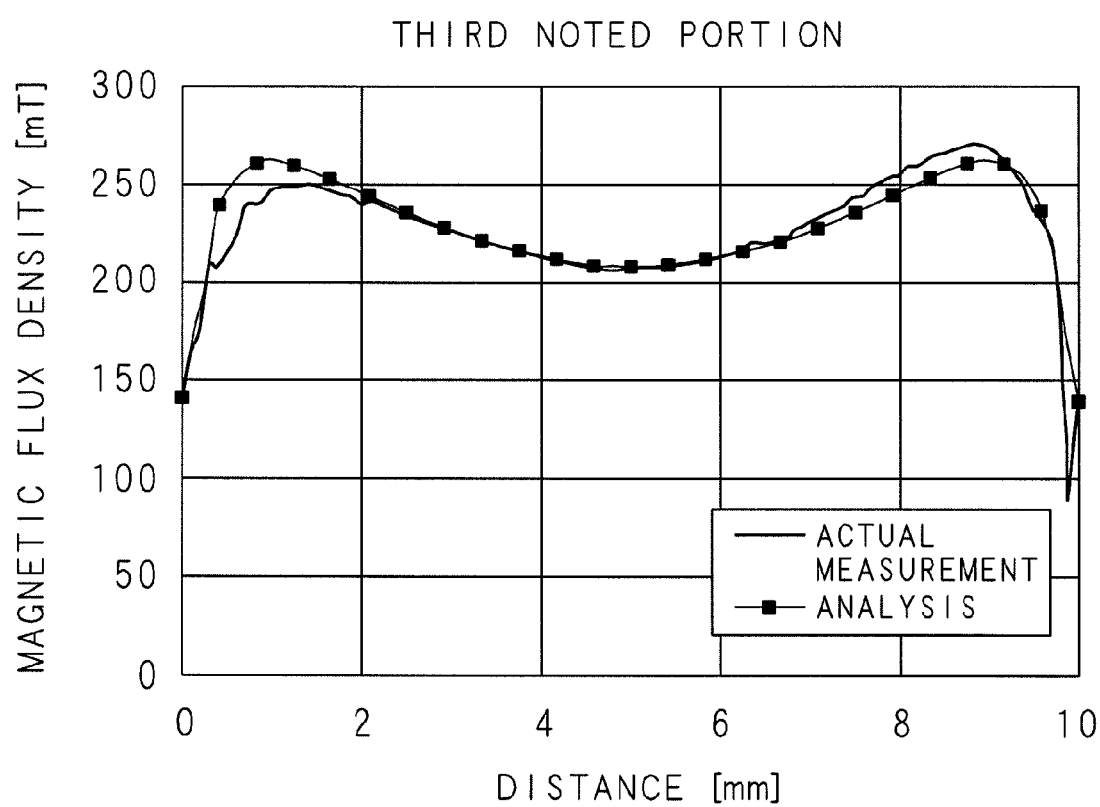
FIG. 12 is a characteristic view showing an analysis result corresponding to a third noted portion of the permanent magnet in an incomplete magnetic state that is calculated by the magnetization analysis device according to the embodiment 1 of the present invention.

FIGS. 10, 11, and 12 relate to the permanent magnet 3 which is intentionally and incompletely magnetized by adjusting the magnitude of the magnetizing magnetic field, and are characteristic views showing the analysis results calculated by the magnetization analysis device 1 according to the first, second and third noted portions 3a, 3b, and 3c of the permanent magnet 3 in the incomplete magnetization state. In S20 shown in FIG. 9, such the characteristic views are displayed on the output screen.

The horizontal axes in FIGS. 10, 11, and 12 indicate positions on the noted portions 3a, 3b, and 3c (specifically, distance [mm] from one end of the permanent magnet 3), while the vertical axes therein represent the remanence B [mT]. The position at 0 [mm] corresponds to the one end described above, and the position at 10 [mm] corresponds to the other end of the permanent magnet.

In each of FIGS. 10, 11, and 12, a graph, indicated by plots (black square marks) and the solid line, shows the analysis result, while a graph indicated by the solid line shows the actual measurement result.

As shown in each of FIGS. 10, 11, and 12, the magnetic flux distribution as the analysis result calculated by the magnetization analysis device 1 and the actually measured magnetic flux distribution substantially coincide with each other. Especially, the analysis result and the actual measurement result corresponding to the distance of 2 [mm] to 8 [mm] (i.e., the central portion of the permanent magnet) coincide with each other very well.

There is a larger difference between the analysis result and the actual measurement result corresponding to the distance near 1 [mm] and the distance near 9 [mm] (i.e., in the vicinity of each of one end and the other end of the permanent magnet 3) than the difference around the central portion. It is considered that such an error is associated with the approximation the demagnetization characteristic of the incomplete magnetic state by the recoil ratio permeability $\mu$ and the coercivity $H_{cb}$, the instability of the permanent magnet in the incomplete magnetization state, the susceptibility of physical properties thereof to fluctuations, and the like. Therefore, it is also considered that further improvement in precision is achieved by using data of the demagnetization curve obtained by the actual measurement as the demagnetization characteristic of the incomplete magnetization state.

FIGS. 13 and 14 are characteristic views showing the analysis results of the permanent magnets with the magnetization rate of 44% and 50%. The magnetization rate of, e.g., 44% mentioned herein, means the state in which magnetization is incompletely performed to obtain 44% total amount of magnetic flux of a completely magnetized permanent magnet.

In the same manner as in FIGS. 10, 11, and 12, the horizontal axis in each of FIGS. 13 and 14 indicates, e.g., the position on the noted portion 3a, while the vertical axis therein represents the remanence B [mT]. A graph, indicated by plots (black square marks) and the solid line, shows the analysis result, while a graph indicated by the solid line shows the actual measurement result.

Even in the case where the magnetization rates of the permanent magnet are different as shown in each of FIGS. 13 and 14, the magnetic flux distribution calculated by the magnetization analysis device 1 as the analysis result and the actually measured magnetic flux distribution substantially coincide with each other.

FIG. 15 is a characteristic view showing the analysis result of the permanent magnet in the complete magnetic state (the magnetization rate of 100%) calculated by the conventional magnetic field analysis method shown in FIG. 6. FIG. 16 is a characteristic view showing the analysis result of the permanent magnet in the incomplete magnetic state (the magnetization rate of 44%) calculated by the conventional magnetic field analysis method.

The horizontal axis in each of FIGS. 15 and 16 indicates the position of a noted portion on the surface of the permanent magnet such as, e.g., the noted portion 3a shown in FIG. 2 (specifically, the distance [mm] from one end of the permanent magnet), while the vertical axis therein represents the remanence B [mT]. The position at 0 [mm] corresponds to the one end described above, and the position at 10 [mm] corresponds to the other end of the permanent magnet.

In each of FIGS. 15 and 16, a graph, indicated by plots (black square marks) and the solid line, shows the analysis result, while a graph indicated by the solid line shows the actual measurement result. The actual measurement result shown in FIG. 16 is identical with the actual measurement result shown in FIG. 13.

As shown in FIG. 15, even in the case where the conventional magnetic field analysis method is used, the analysis result and the actual measurement result of the permanent magnet in the complete magnetic state substantially coincide with each other.

However, when the conventional magnetic field analysis method is used, the analysis result and the actual measurement result of the permanent magnet in the incomplete magnetic state are considerably different from each other, as shown in FIG. 16. Especially, the analysis result and the actual measurement result corresponding to the distance of 2 [mm] to 8 [mm] (i.e., the central portion of the permanent magnet) are extremely different from each other.

It becomes possible to reduce such an error by performing the magnetization analysis process by the magnetization analysis device 1 in accordance with the magnetic field analysis method of the present embodiment which analyzes the magnetic state with high precision in consideration even of the incomplete magnetization region of the permanent magnet as described above (see FIG. 13).

It is to be noted herein that the initial magnetization curve and the demagnetization curve which are measured with the use of the magnetic material 30 respectively can be used for a magnetization analysis process of a permanent magnet obtained by magnetizing a magnetic material that is the same type as the magnetic material 30. Therefore, it is not necessary to obtain the initial magnetization curve and the demagnetization curve by the actual measurement every time of the magnetization analysis, in the case that the permanent magnets have the same type of magnet materials and have different shapes or different sizes. That is, it is possible to apply one initial magnetization curve and one demagnetization curve for several magnetization analyses, whereby the convenience of the analysis operation is improved.

In the present embodiment, although a computer program according to the present invention is stored in a recording medium (CD-ROM 2) having portability and is distributed, a means for distribution is not limited thereto. The computer program may be distributed via a communications network. Alternatively, the computer program may be stored, in advance, in a program storing means (e.g., a ROM) of the magnetization analysis device which consists of a computer.

Such a computer program may be executed after being installed in a volatile or nonvolatile storing means (e.g., a RAM or a hard disk) or may be directly executed after reading from a recording medium or a distributor.

Such a computer program can implement the magnetizing magnetic field calculating means, the parameter calculating means, and the magnetic state calculating means in software, with the use of hardware elements of the computer.

Although the present embodiment has illustrated the permanent magnet 3 that comprises a rare earth element and is magnetized in a single pole, the type of the magnet is not limited thereto. The present invention may be applied to magnets comprising other than the rare earth element, or being magnetized in multiple poles.

In addition, although the present invention has illustrated the permanent magnet in the shape of a rectangular parallelepiped, the shape is not limited thereto. The present invention may be applied to permanent magnets having different shapes such as an annular shape, a tubular shape, or the like.

(Embodiment 2)

FIG. 17 is a schematic perspective view of a magnetic material 31 to be made into a permanent magnet 32 that is an analysis target of a magnetic field analysis method according to a second embodiment of the present invention. FIG. 18 is a characteristic view showing the initial magnetization curve of the permanent magnet 32 used in the magnetic field analysis method, wherein the horizontal axis represents the magnetic field H [kA/m], while the vertical axis represents the remanence B [T].

In the present embodiment, a description will be given to the magnetic field analysis method having the permanent magnet 32, as an analysis target, that is obtained by magnetizing the magnetic material 31 with a magnetizer 4 corresponding to the magnetizer 4 of embodiment 1 shown in FIG. 3. However, the magnetizer 4 of the present embodiment comprises a magnetizing coil different from the air core coil 41.

A magnetization analysis device 1 according to the present embodiment is configured in substantially the same manner as the magnetization analysis device 1 of embodiment 1 shown in FIG. 1.

Furthermore, descriptions for parts corresponding to those of embodiment 1 will be omitted by retaining the same reference numerals.

As shown in FIG. 17, the permanent magnet 32 has a cylindrical shape, is mounted on the periphery of a shaft SH of an electric motor, and is used to form a rotor.

More particularly, the permanent magnet 32 is radial anisotropic Nd—Fe—B sintered magnet, which has the outside diameter of 36.45 [mm], the inside diameter of 30.45 [mm], and the length in the direction of axial length of 21 [mm], and is obtained by alternately skew-magnetizing the magnetic material 31 having the cylindrical shape to different polarities. The skew angle of the permanent magnet 32 is 13.3 [°] with respect to the direction of axial length. The permanent magnet 32 magnetized in this manner is an integral ring where N pole on a peripheral surface side 32a and S pole on the peripheral surface side 32b are alternately formed in a circumferential direction. In other words, the magnetizing direction of the permanent magnet 32 is in a radial direction.

The permanent magnet 32 magnetized in multiple poles in this manner (specifically, magnetized in six poles) has an incomplete magnetization region (neutral zone) in portions between poles. In the conventional magnetic field analysis method, the incomplete magnetization region has been determined from experiences (e.g., 1 [mm]). For the analysis, then, the incomplete magnetization region has been presumed to be a non-magnetized region, and the other regions have been presumed to be completely magnetized regions.

In the present embodiment, a noted portion 3d is set at the position, 1 [mm] apart from peripheral surface of center portion in the axial direction of the permanent magnet 32 and along the circumferential direction (see FIG. 17). It is compared a magnetic flux density distribution of the noted portion 3d which is measured by measurement equipment not shown (i.e., the actual measurement result) with a magnetic flux density distribution of the noted portion 3d which is calculated by the magnetization analysis device 1 (i.e., the analysis result).

Hereinbelow, the magnetic flux density distribution of the noted portion 3d is referred to as a magnetic flux distribution. Each of FIGS. 22 to 24, which will be described later, shows the magnetic flux distribution of the noted portion 3d having the shape of an arc corresponding to 120° that continuously extends from one end portion in the circumferential direction of the N pole on the peripheral surface side 32a to the other end portion in the circumferential direction of the S pole on the peripheral surface side 32b which is adjacent to the N pole on the peripheral surface side 32a. Further, the one end portion in the circumferential direction of the N pole on the peripheral surface side 32a is set at the position of 0 [°].

In addition, the magnetic material 31 is an anisotropic magnetic substance comprising a rare earth element, and the magnetic material 31 has the resistance value of $144 \times 10^{-8}$ [Ω·m], the residual flux density of 1.23 [T], and the coercivity of not less than 1671 [kA/m].

Further, the magnetizing characteristic of the magnetic material 31 is nonlinear and the initial magnetization curve as shown in FIG. 18 is data to show the magnetization characteristic. The initial magnetization curve is obtained by actually measuring in advance the magnetic material 31 to be made into the permanent magnet 32 that is an analysis target, and corresponds to the applied magnetizing magnetic field.

The material, the resistance value, and the initial magnetization curve of the magnetic material 31 are used as magnet parameters (i.e., magnet characteristics) inherent to the magnetic material 31 when a magnetic field analysis is performed.

The magnetic material 31 is disposed at the central position in the magnetizing coil of the magnetizer 4, and is subjected for the skew magnetization to be the permanent magnet 32.

Here, the number of turns of the magnetizing coil is 6 [turn], the resistance value of the magnetizing coil is 24.6 [mΩ], the electrostatic capacitance of the capacitor 43 is 4000 [μF], the voltage at both ends of the capacitor 43 (i.e., the magnetizing voltage) is 1000 to 3000 [V], and the internal resistance value of the magnetizer 4 is 44 [mΩ].

The number of turns and the resistance value of the magnetizing coil, the electrostatic capacitance and the magnetizing voltage of the capacitor 43, and the internal resistance value of the magnetizer 4 are used as magnetizer parameters (i.e., circuit conditions) inherent to the magnetizer 4 when the magnetization analysis is performed. In the present embodiment, by focusing attention on the magnetizing voltage of the capacitor 43 that is one of the circuit conditions, the magnetization analysis is performed under three kinds of conditions, that is, the first condition (1000 [V]), the second condition (2000 [V]), and the third condition (3000 [V]). Hereinafter, the three kinds of conditions are referred to as magnetizing conditions.

In the magnetization analysis in the present embodiment, the finite element method is used to produce the mesh division model and the transient response analysis is performed. In this case, the mesh division model is produced to correspond to the shape and size of the magnetizing coil, and further correspond to the shape and size of the magnetic material 31 (will be the permanent magnet 32.

The shape and size of the magnetizing coil, the shape and size of the magnetic material 31 (i.e., the shape and size of the permanent magnet 32), and the mesh division models (i.e., model shapes) thereof are used to perform the magnetization analysis.

FIG. 19 is a characteristic view showing each of demagnetization curves 500 to 560 that are used in the magnetic field analysis method according to embodiment 2 of the present invention, and is also a characteristic view showing the demagnetization curve 500 for the completely magnetized region and the demagnetization curves 510 to 560 for the incomplete magnetization region that are obtained by actual measurement in advance. In FIG. 19, the horizontal axis represents the magnetic field H [kA/m], while the vertical axis represents the remanence B [T].

The demagnetization curves 510 to 560 shown in FIG. 19 are obtained by the actual measurement with the use of the magnetic material 31 to be made into the permanent magnet 32 that is an analysis target. Specifically, the demagnetization curves are obtained by actually measuring a permanent magnet in the incomplete magnetic state that is obtained by applying the magnetizing magnetic field of 1405, 1015, 834, 661, 484, or 306 [kA/m] to the magnetic material 31, and correspond to the magnetizing magnetic fields to be applied.

The demagnetization curve 500 shown in FIG. 19 is a demagnetization curve for the completely magnetized region of the permanent magnet that is obtained by applying the magnetizing magnetic field of 5570 [kA/m] to the magnetic material 31.

On the basis of the demagnetization curves described above, the coercivity $H_{cb}$ and the recoil ratio permeability μ are calculated. FIG. 19 shows the coercivity $H_{cb}$ and the recoil ratio permeability μ of the demagnetization curve 540.

The negative number of the coercivity "$-H_{cb}$" is a value at an intersection point of the demagnetization curve and the horizontal axis, and the recoil ratio permeability μ is the gradient of the demagnetization curve. The recoil ratio permeability μ and the coercivity $H_{cb}$ are parameters that approximately represent the demagnetization characteristic.

FIG. 20 is a characteristic view showing the relationship between the magnetizing magnetic field H and the coercivity $H_{cb}$ for the completely magnetized region and the incomplete magnetization region. The horizontal axis represents the magnetizing magnetic field H [kA/m], while the vertical axis represents the coercivity $H_{cb}$ [kA/m]. FIG. 21 is a characteristic view showing the relationship between the magnetizing magnetic field H and the recoil ratio permeability μ for the completely magnetized region and the incomplete magnetization region. The horizontal axis represents the magnetizing magnetic field H [kA/m], while the vertical axis represents the recoil ratio permeability μ. Each of FIGS. 20 and 21 corresponds to the definition of the demagnetization curves, as shown in FIG. 19, that is based on the actual measurement.

Since the characteristic views in FIGS. 19, 20, and 21 respectively correspond to the characteristic views in FIGS. 5, 7, and 8 of embodiment 1, the detailed description thereof will be omitted.

The procedure for the magnetization analysis process by the magnetization analysis device 1 in the present embodiment is similar to the procedure for the magnetization analysis process shown in FIG. 9 of embodiment 1.

Therefore, after the completion of acceptance of various data by executing S11 to S16, the CPU 10 of the magnetization analysis device 1 performs the magnetic field analysis by the finite element method with the suitable use of data such as the circuit conditions, the magnet characteristics, the model shapes, or the like, among the accepted data. Then, the CPU 10 calculates the applied magnetizing magnetic field to each mesh element in the mesh division models of the magnetic material 31 in S17).

Next, the CPU 10 calculates the recoil ratio permeability μ and the coercivity $H_{cb}$ for each mesh element on the basis of the calculation result of the magnetizing magnetic field for each mesh element in S17 and data of the demagnetization curve (process in S18).

Further, the CPU 10 performs the magnetic field analysis with the use of the recoil ratio permeability μ and the coercivity $H_{cb}$ for each mesh element, which are obtained in S18. The state parameters are calculated that represent the magnetic state of the permanent magnet 32 (process in S19).

Finally, the CPU 10 causes the display unit 13 to display an output screen that is obtained by editing the state parameters calculated in S19 into a predetermined format (process in S20), and then ends the magnetization analysis process.

In S20, the CPU 10 calculates the remanence B for the noted portion 3d shown in FIG. 17 on the basis of the state parameters calculated in S19, and causes the display unit 13 to display a graph of the magnetic flux distribution corresponding to the noted portion 3d. In the present embodiment, the magnetic flux distribution is the analysis result.

FIGS. 22, 23, and 24 are characteristic views showing the analysis result for the noted portion 3d of the permanent magnet 32 under the first, second, and third conditions, that is calculated by the magnetization analysis device 1 according to embodiment 2 of the present invention. In the process in S20, these characteristic views are shown on the output screen. The horizontal axis in each of the characteristic views indicates a position [°] on the noted portion 3d, while the vertical axis therein represents the remanence B [T]. The position at 0 [°] in the horizontal axis is the one end portion in the circumferential direction mentioned above, and the position at 120 [°] is the other end portion in the circumferential direction described above. The graph indicated by the solid line is the analysis result, and the graph indicated by the broken line is the actual measurement result.

As shown in each of FIGS. 22, 23, and 24, in the magnetic flux distribution as the analysis result calculated by the magnetization analysis device 1 and the actual measured magnetic flux distribution, the peak magnetic flux densities thereof coincide with each other very well for any magnetizing conditions, and the tendencies of the magnetic flux density distributions in a zero crossing portion in the vicinity of 60 [°] also coincide with each other. In other words, in the magnetic field analysis method of the present invention, the magnetic state obtained by the magnetization analysis and the actual measured magnetic state coincide with each other very well. The reason is that sufficient consideration is given to the incomplete magnetization region (neutral zone) of the permanent magnet 32 with the use of the demagnetization curve on the basis of the actual measurement.

FIG. 25 is a characteristic view showing a no-load induced voltage of an electric motor comprising the permanent magnet 32 that is obtained by magnetization under each of the first, second, and third magnetizing conditions. The horizontal axis represents the magnetizing voltage [V], while the vertical axis represents the no-load induced voltage [V/krpm].

In FIG. 25, just plots (black circular marks) show actually measured values of the no-load induced voltage of the electric motor comprising the permanent magnet 32 that is obtained by magnetization under each of the magnetizing. In addition, plots (white circular marks) and the solid line show calculated values of the no-load induced voltage determined on the basis of the analysis result under each of the magnetizing conditions that are calculated by the magnetization analysis device 1. Further, the broken line shows calculated values of the no-load induced voltage (12.1 [V/krpm]) determined on the basis of the analysis result under each of the magnetizing conditions calculated by the conventional magnetic field analysis method.

As shown in FIG. 25, it coincides very well the actual measured values with the calculated values of the no-load induced voltage that is obtained on the basis of the analysis result according to the magnetic field analysis method of the present invention. However, there is large difference between the actual measured values and the calculated values of the no-load induced voltage that is obtained on the basis of the analysis result according to the conventional magnetic field analysis method. This difference tends to be especially larger as the magnetizing voltage becomes lower.

The characteristic view shown in FIG. 25 indicates that an equipment characteristic which is planed at design time may be different from an equipment characteristic of the actually manufactured equipment and then a desired characteristic may not be obtained, when the conventional magnetic field analysis method is used. However, the characteristic view shown in FIG. 25 indicates that the equipment characteristic which is planed at design time coincides with the equipment characteristic of the actually manufactured equipment and then a desired characteristic can be obtained easily, when the magnetic field analysis method of the present invention is used.

Various numeral values described in embodiment 1 and embodiment 2 (e.g., the size of the permanent magnets 3 and 32) are illustrative and they are not limited thereto.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A magnetic field analysis method for analyzing a magnetic state of a permanent magnet obtained by magnetizing a magnetic material with a magnetizer, comprising:
preparing a demagnetization curve by actual measurement of each incomplete magnetization region of a test permanent magnet, wherein the test permanent magnet was obtained by application of a magnetizing magnetic field to a magnetic material;

calculating, with the use of said demagnetization curve, a region parameter related to an incomplete magnetization region of a permanent magnet to be analyzed, wherein the permanent magnet
is the test permanent magnet, or
is made of the same type of magnetic material as the test permanent magnet; and analyzing a magnetic state of the permanent magnet with the use of the calculated region parameter, wherein the incomplete magnetization region of the permanent magnet represents a region which cannot be magnetized until the permanent magnet is saturated.

2. The magnetic field analysis method of claim 1, further comprising:

calculating the applied magnetizing magnetic field to each portion of the magnetic material by performing a magnetic field analysis, with the use of a magnetizer parameter related to the magnetizer and a magnet parameter related to the magnetic material; and calculating a state parameter representing magnetic state of the permanent magnet to be analyzed by performing a magnetic field analysis with the use of the calculated region parameter, wherein in the step of calculating the region parameter, the region parameter is calculated for each portion of the permanent magnet on the basis of the calculated applied magnetizing magnetic field and the demagnetization curve; and in the step of analyzing a magnetic state of the permanent magnet, the magnetic state is analyzed with the use of the calculated state parameter.

3. The magnetic field analysis method of claim 2, wherein a recoil ratio permeability and a coercivity, which approximately represent a demagnetization characteristic of the incomplete magnetization region of the permanent magnet, are used as the region parameter.

4. The magnetic field analysis method of claim 1, wherein a recoil ratio permeability and a coercivity, which approximately represent a demagnetization characteristic of the incomplete magnetization region of the permanent magnet are used as the region parameter.

5. A magnetization analysis device for analyzing a magnetic state of a permanent magnet obtained by magnetizing a magnetic material with a magnetizer, comprising:

an applied magnetizing magnetic field calculating means for calculating an applied magnetizing magnetic field to each portion of the magnetic material, by performing a magnetic field analysis with the use of a magnetizer parameter related to the magnetizer and a magnet parameter related to the magnetic material;

a parameter calculating means for calculating a region parameter related to each incomplete magnetization region of the permanent magnet to be analyzed, on the basis of
the calculated applied magnetizing magnetic field by the applied magnetizing magnetic field calculating means and
a demagnetization curve obtained by actual measurement of each incomplete magnetization region of a test permanent magnet in advance and corresponding to a magnetizing magnetic field to be applied to the permanent magnet to be analyzed, wherein the permanent magnet to be analyzed
is the test permanent magnet, or
is made of the same type of magnetic material as the test permanent magnet, wherein the incomplete magnetization region of the permanent magnet to be analyzed represents a region which cannot be magnetized until the permanent magnet is saturated; and a magnetic state calculating means for calculating a state parameter representing a magnetic state of the permanent magnet to be analyzed, by performing a magnetic field analysis with the use of the calculated region parameter by the parameter calculating means, wherein the magnetic state of the permanent magnet is analyzed on the basis of the calculated state parameter.

6. A magnetization analysis device for analyzing a magnetic state of a permanent magnet obtained by magnetizing a magnetic material with a magnetizer, comprising:

an applied magnetizing magnetic field calculating unit that calculates an applied magnetizing magnetic field to each portion of the magnetic material, by performing a magnetic field analysis with the use of a magnetizer parameter related to the magnetizer and a magnet parameter related to the magnetic material;

a parameter calculating unit that calculates a region parameter related to each incomplete magnetization region of the permanent magnet to be analyzed, on the basis of
the calculated applied magnetizing magnetic field by the applied magnetizing magnetic field calculating unit and
a demagnetization curve obtained by actual measurement of each incomplete magnetization region of a test permanent magnet in advance and corresponding to a magnetizing magnetic field to be applied to the permanent magnet to be analyzed, wherein the permanent magnet to be analyzed
is the test permanent magnet or
is made of the same type of magnetic material as the test permanent magnet, wherein the incomplete magnetization region of the permanent magnet to be analyzed represents a region which cannot be magnetized until the permanent magnet is saturated; and a magnetic state calculating unit that calculates a state parameter representing a magnetic state of the permanent magnet to be analyzed, by performing a magnetic field analysis with the use of the calculated region parameter by the parameter calculating unit, wherein the magnetic state of the permanent magnet is analyzed on the basis of the calculated state parameter.

7. A magnetization analysis device for analyzing a magnetic state of a permanent magnet obtained by magnetizing a magnetic material with a magnetizer, comprising:

a controller capable of performing the following operations of:

calculating an applied magnetizing magnetic field to each portion of the magnetic material, by performing a magnetic field analysis with the use of a magnetizer parameter related to the magnetizer and a magnet parameter related to the magnetic material;

calculating a region parameter related to each incomplete magnetization region of the permanent magnet to be analyzed, on the basis of
the calculated applied magnetizing magnetic field and
a demagnetization curve obtained by actual measurement of each incomplete magnetization region of a test permanent magnet in advance and corresponding to a magnetizing magnetic field to be applied to the permanent magnet to be analyzed,
wherein the permanent magnet to be analyzed
is the test permanent magnet, or
is made of the same type of magnetic material as the test permanent magnet,
wherein the incomplete magnetization region of the permanent magnet to be analyzed represents a region which cannot he magnetized until the permanent magnet is saturated; and
calculating a state parameter representing a magnetic state of the permanent magnet to be analyzed, by performing a magnetic field analysis with the use of the calculated region parameter; and
analyzing the magnetic state of the permanent on the basis of the calculated state parameter.

8. A non-transitory recording medium with a computer program for causing a computer to analyze a magnetic state of a permanent magnet obtained by magnetizing a magnetic material with a magnetizer, wherein
the computer program comprises:
a step of causing the computer to calculate an applied magnetizing magnetic field to each portion of the magnetic material by performing a magnetic field analysis with the use of a magnetizer parameter related to the magnetizer and a magnet parameter related to the magnetic material;
a step of causing the computer to calculate a region parameter related to each incomplete magnetization region of the permanent magnet to be analyzed, on the basis of the calculated applied magnetic field and a given demagnetization curve,
wherein the incomplete magnetization region of the permanent magnet to be analyzed represents a region which cannot be magnetized until the permanent magnet is saturated; and
a step of causing the computer to calculate a state parameter representing a magnetic state of the permanent magnet to be analyzed by performing a magnetic field analysis with the use of the calculated region parameter; and
a step of causing the computer to analyze the magnetic state of the permanent on the basis of the calculated state parameter.

* * * * *